United States Patent
Lee et al.

(10) Patent No.: US 12,426,422 B2
(45) Date of Patent: Sep. 23, 2025

(54) DISPLAY DEVICE HAVING SUPPORT MODULE ON SIDE SURFACE OF SUBSTRATE

(71) Applicant: LG ELECTRONICS INC., Seoul (KR)

(72) Inventors: Sungguk Lee, Seoul (KR); Dohyung Lee, Seoul (KR); Sangdae Park, Seoul (KR); Hwankuk Yuh, Seoul (KR); Jaegwang Um, Seoul (KR)

(73) Assignee: LG ELECTRONICS INC., Seoul (KR)

(*) Notice: Subject to any disclaimer, the term of this patent is extended or adjusted under 35 U.S.C. 154(b) by 429 days.

(21) Appl. No.: 18/018,493

(22) PCT Filed: Aug. 6, 2020

(86) PCT No.: PCT/KR2020/010437
§ 371 (c)(1),
(2) Date: Jan. 27, 2023

(87) PCT Pub. No.: WO2022/030666
PCT Pub. Date: Feb. 10, 2022

(65) Prior Publication Data
US 2023/0290918 A1 Sep. 14, 2023

(51) Int. Cl.
*H10H 20/857* (2025.01)
*H01L 25/075* (2006.01)

(52) U.S. Cl.
CPC ....... *H10H 20/857* (2025.01); *H01L 25/0753* (2013.01)

(58) Field of Classification Search
CPC .... H10H 20/857; H10H 29/012; H10H 29/45; H10H 29/842; H10H 20/8506;
(Continued)

(56) References Cited

U.S. PATENT DOCUMENTS 11,980,062 B2 * 5/2024 Jeon ............ H10K 50/844
2018/0190631 A1 7/2018 Kim et al.
(Continued)

FOREIGN PATENT DOCUMENTS

JP 2019-53205 A 4/2019
KR 10-2015-0037301 A 4/2015
(Continued)

OTHER PUBLICATIONS

European Search Report for European Application No. 20948881.6, dated Mar. 25, 2024.

*Primary Examiner* — J. E. Schoenholtz
(74) *Attorney, Agent, or Firm* — Birch, Stewart, Kolasch & Birch, LLP

(57) ABSTRACT

Provided is a display device. The display device includes a substrate, a display panel including a display disposed on a front surface of the substrate and a flexible base material extending from the display to surround a portion of each of a side surface and a rear surface of the substrate, and a support layer disposed between the side surface of the substrate and the flexible base material to support the flexible base material. The flexible base material includes: a pair of curved portions spaced apart from the support layer and a side cover portion that is configured to connect the pair of curved portions to each other and is in contact with the support layer.

18 Claims, 17 Drawing Sheets

(58) Field of Classification Search
CPC ............... H10H 20/852; H10H 29/142; H01L 25/0753; H10K 59/18; H10K 77/111; H10K 2102/311; Y02E 10/549; G09F 9/301; G09F 9/3023; G09F 9/33; H10D 86/411; H10D 86/441

See application file for complete search history.

(56) References Cited

U.S. PATENT DOCUMENTS

| | | | |
|---|---|---|---|
| 2019/0008015 A1* | 1/2019 | Tada | ................... H10K 59/30 |
| 2019/0035765 A1 | 1/2019 | Kim et al. | |
| 2019/0305073 A1* | 10/2019 | Chen | ................... H01L 25/0753 |
| 2021/0202630 A1* | 7/2021 | Jeon | ................... H10K 50/844 |

FOREIGN PATENT DOCUMENTS

| | | |
|---|---|---|
| KR | 10-2015-0084257 A | 7/2015 |
| KR | 10-2017-0084402 A | 7/2017 |
| KR | 10-2018-0079079 A | 7/2018 |
| KR | 10-2019-0013170 A | 2/2019 |
| KR | 10-2019-0035103 A | 4/2019 |
| KR | 10-2019-0114767 A | 10/2019 |

* cited by examiner

[FIG. 1]
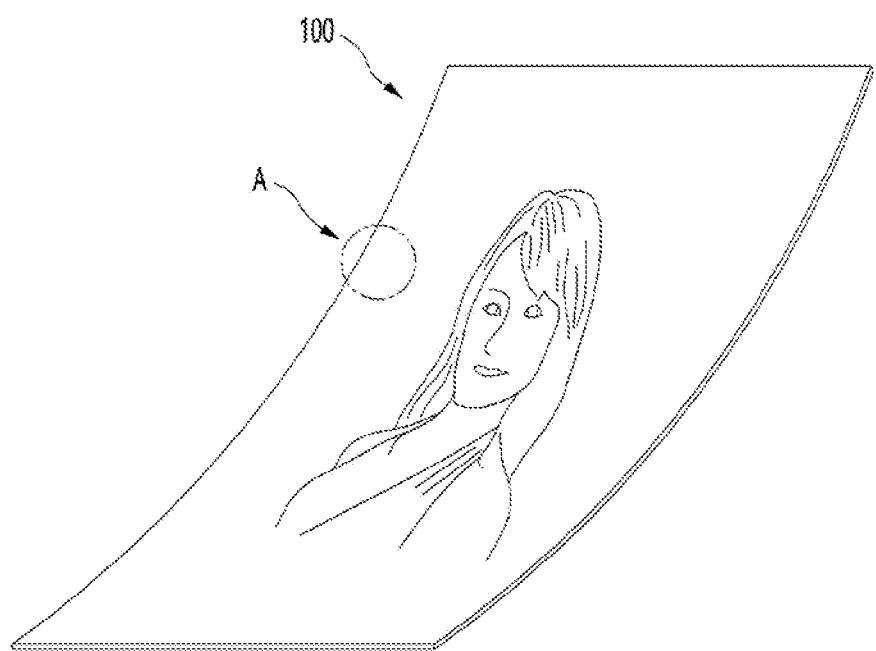

[FIG. 2]
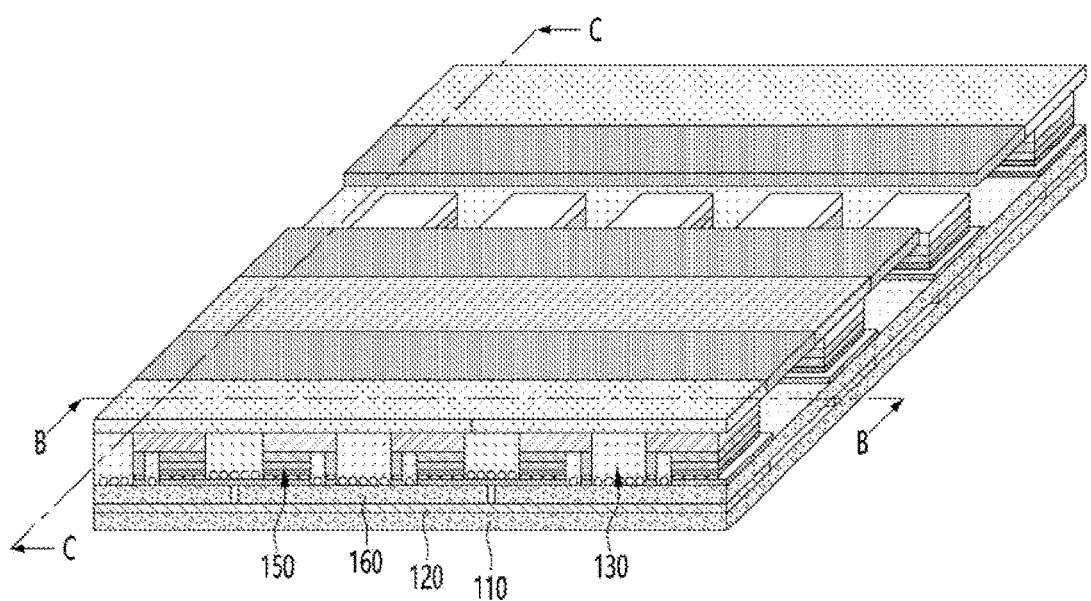

[FIG. 3a]
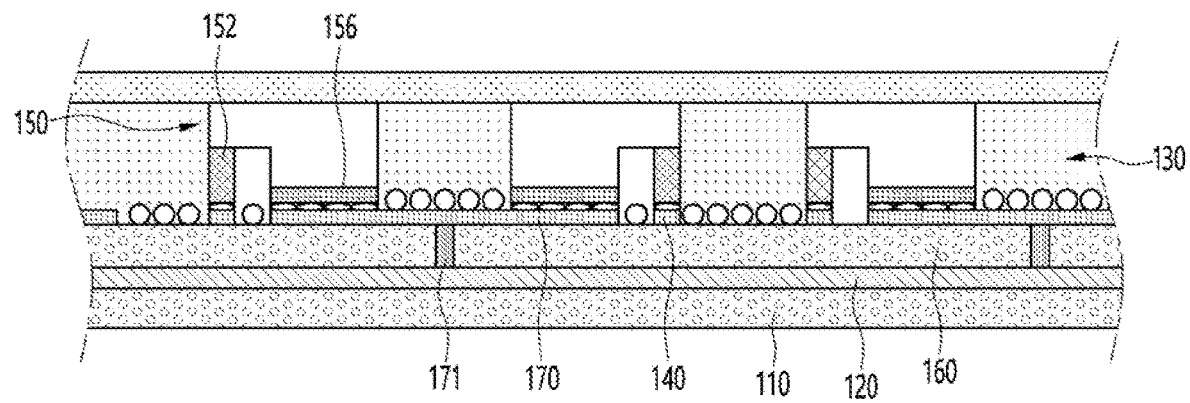
[FIG. 3b]
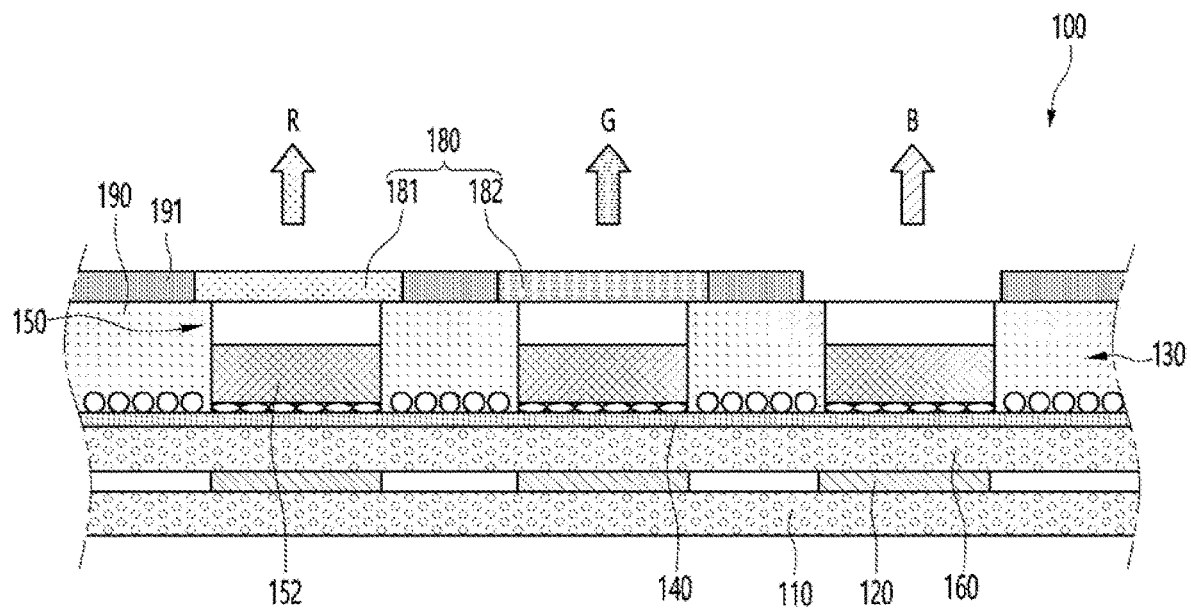

[FIG. 4]
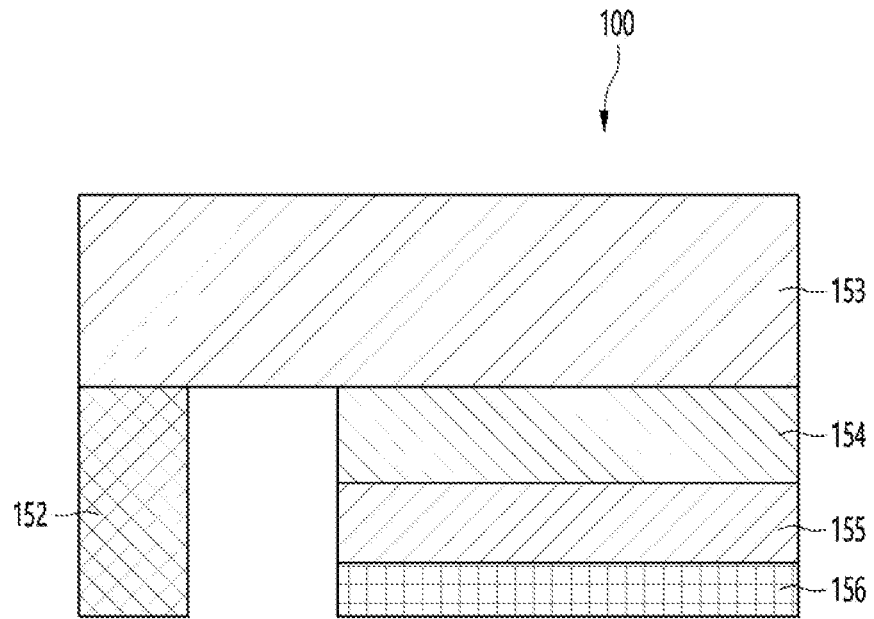
[FIG. 5a]
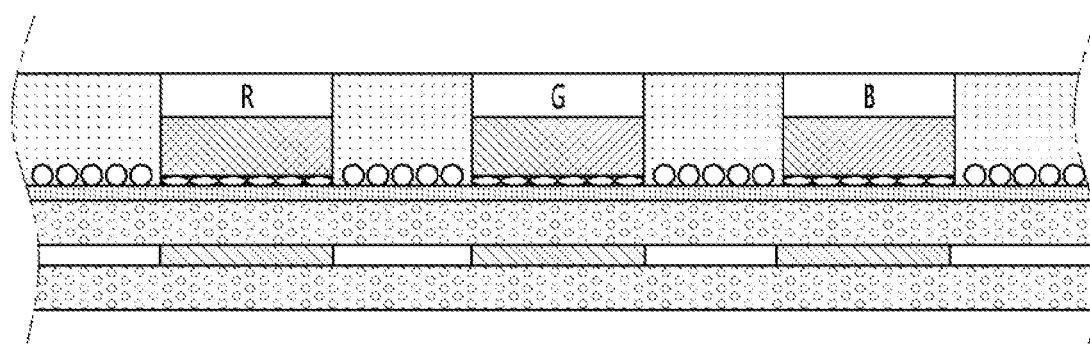

[FIG. 5b]
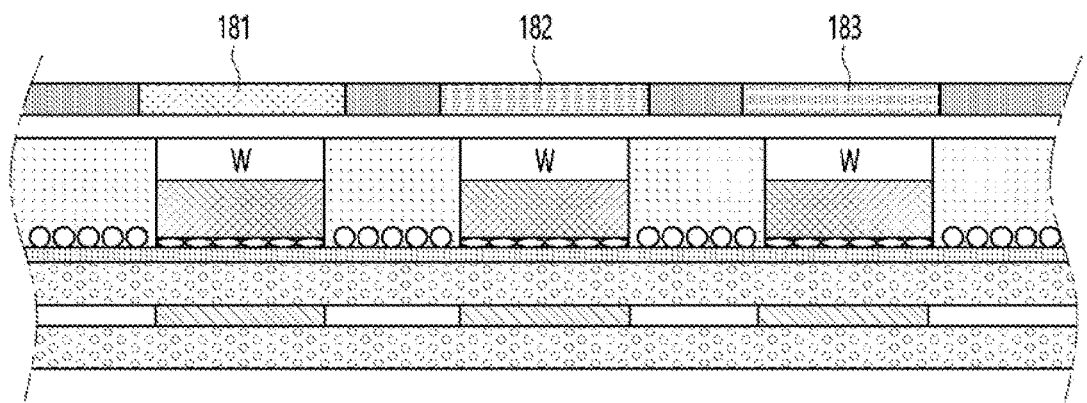
[FIG. 5c]
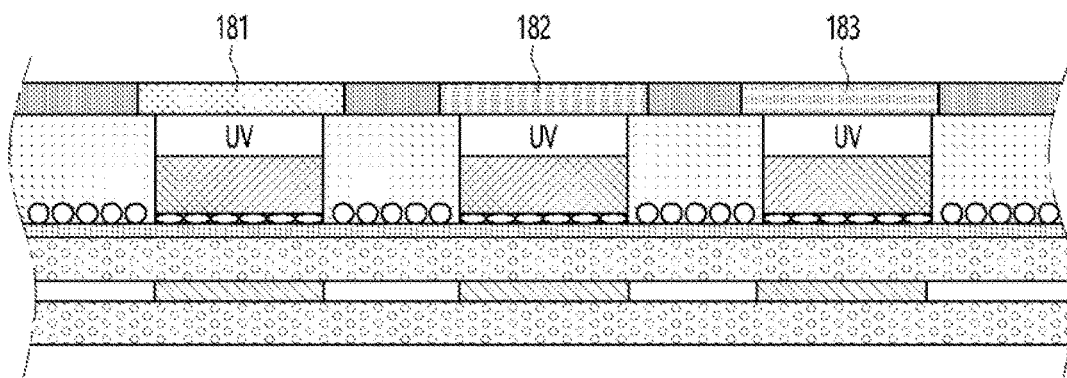

[FIG. 6]
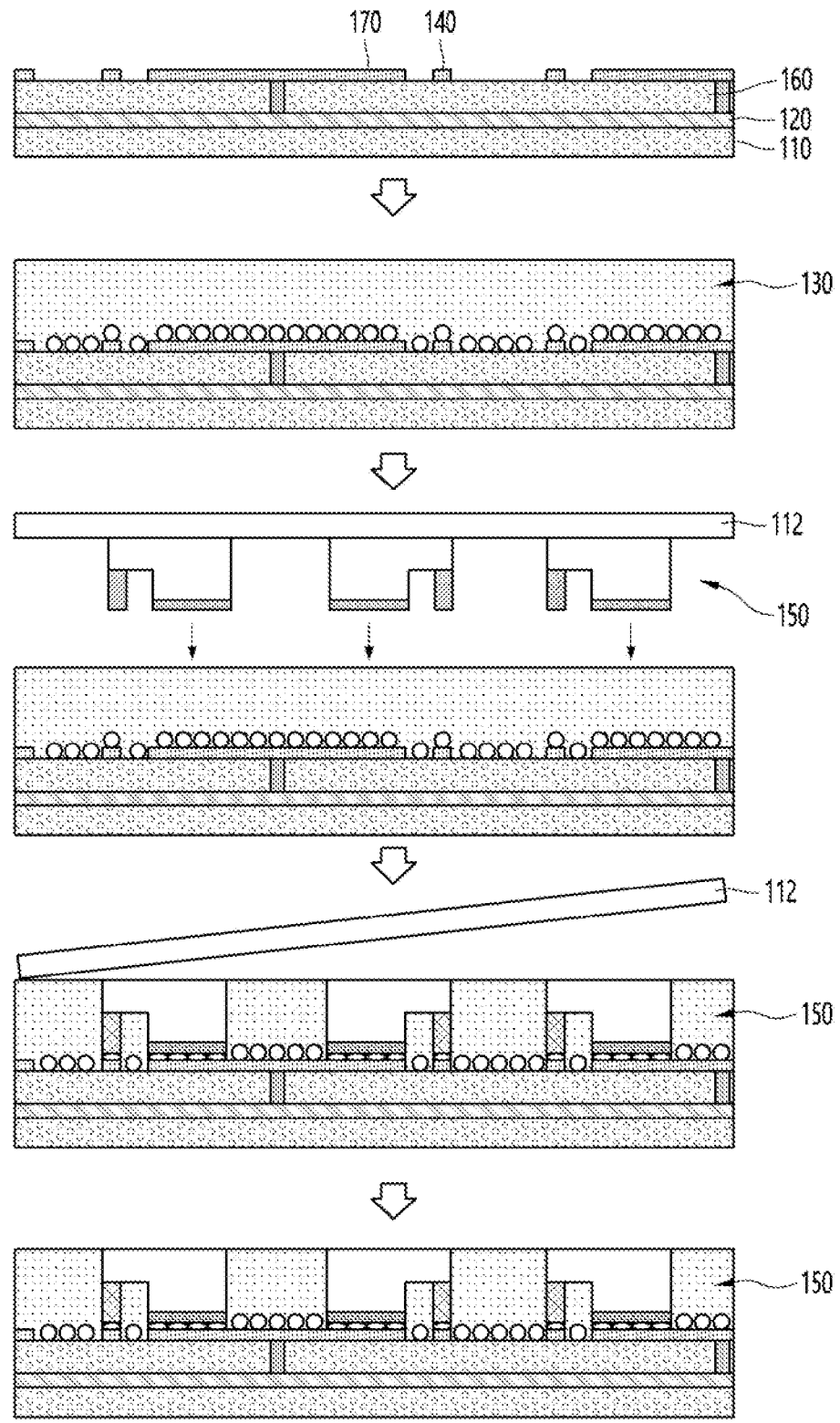

[FIG. 7]
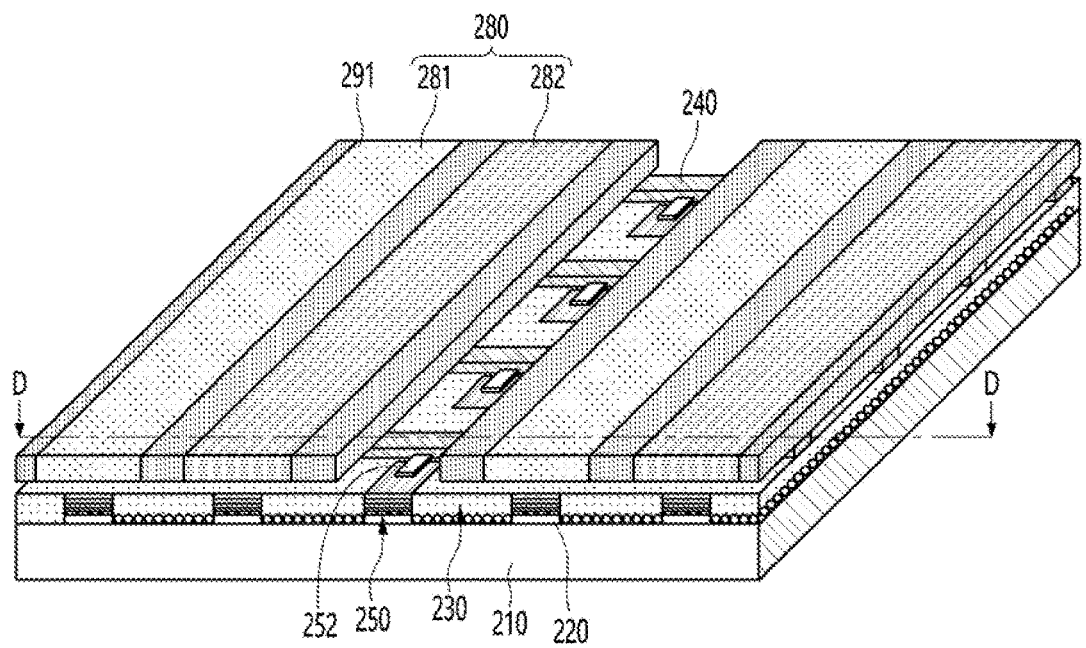
[FIG. 8]
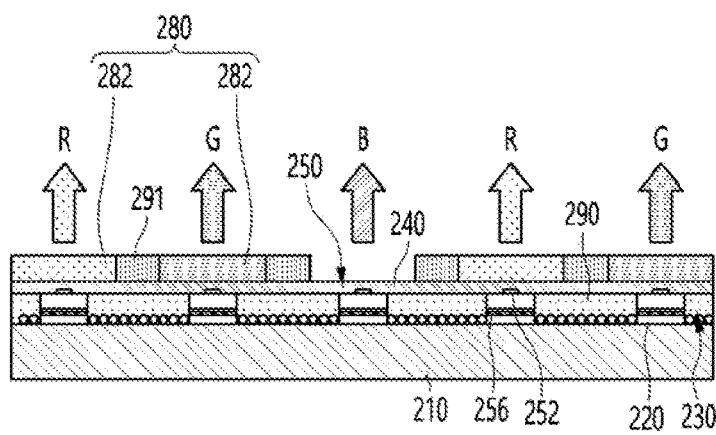

[FIG. 9]
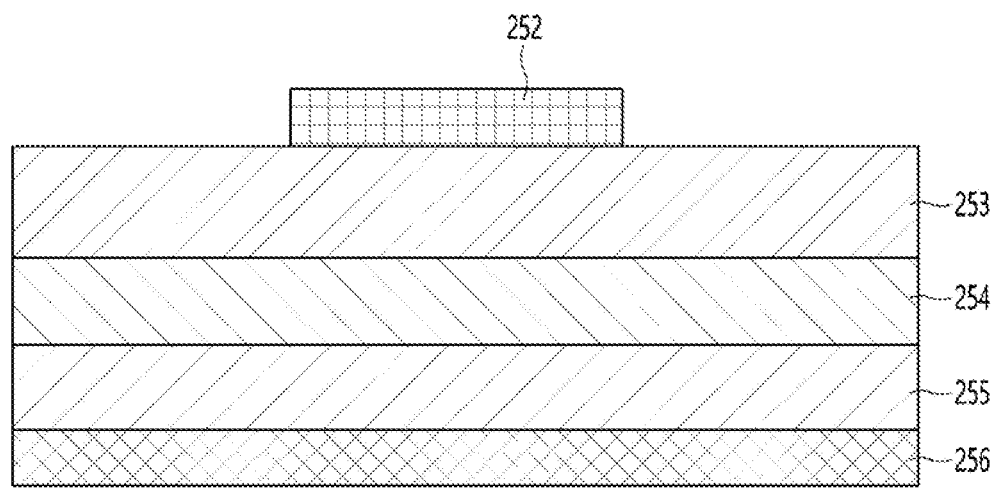

[FIG. 10]
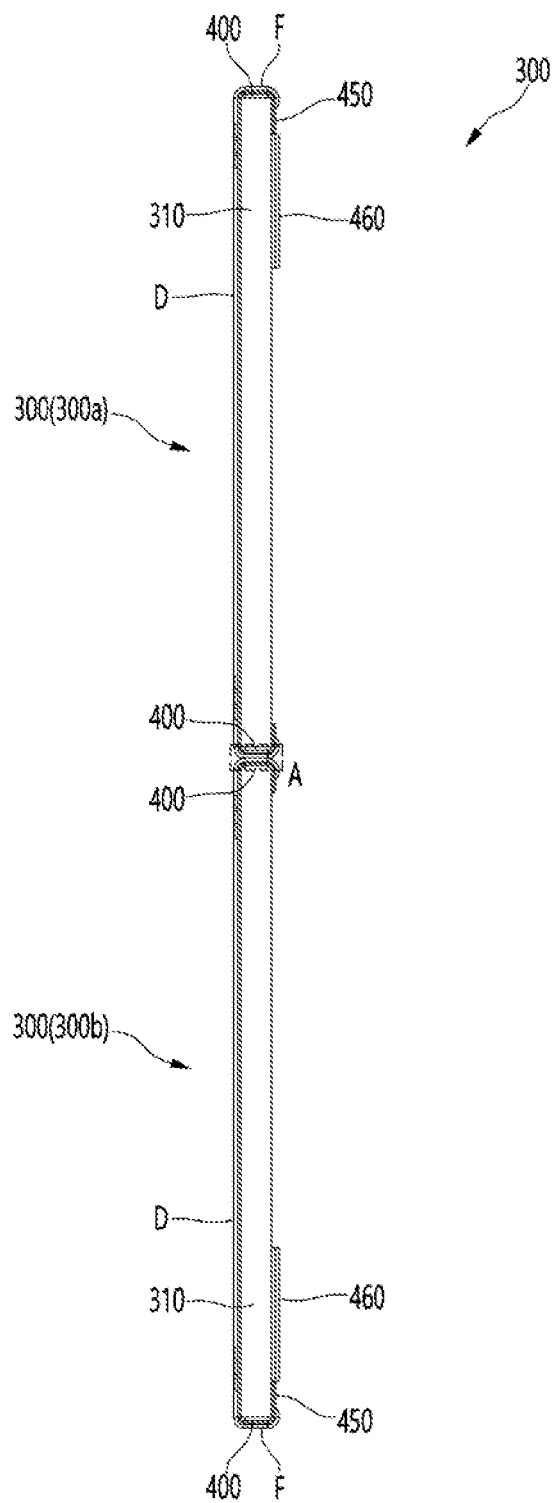

[Fig.11]
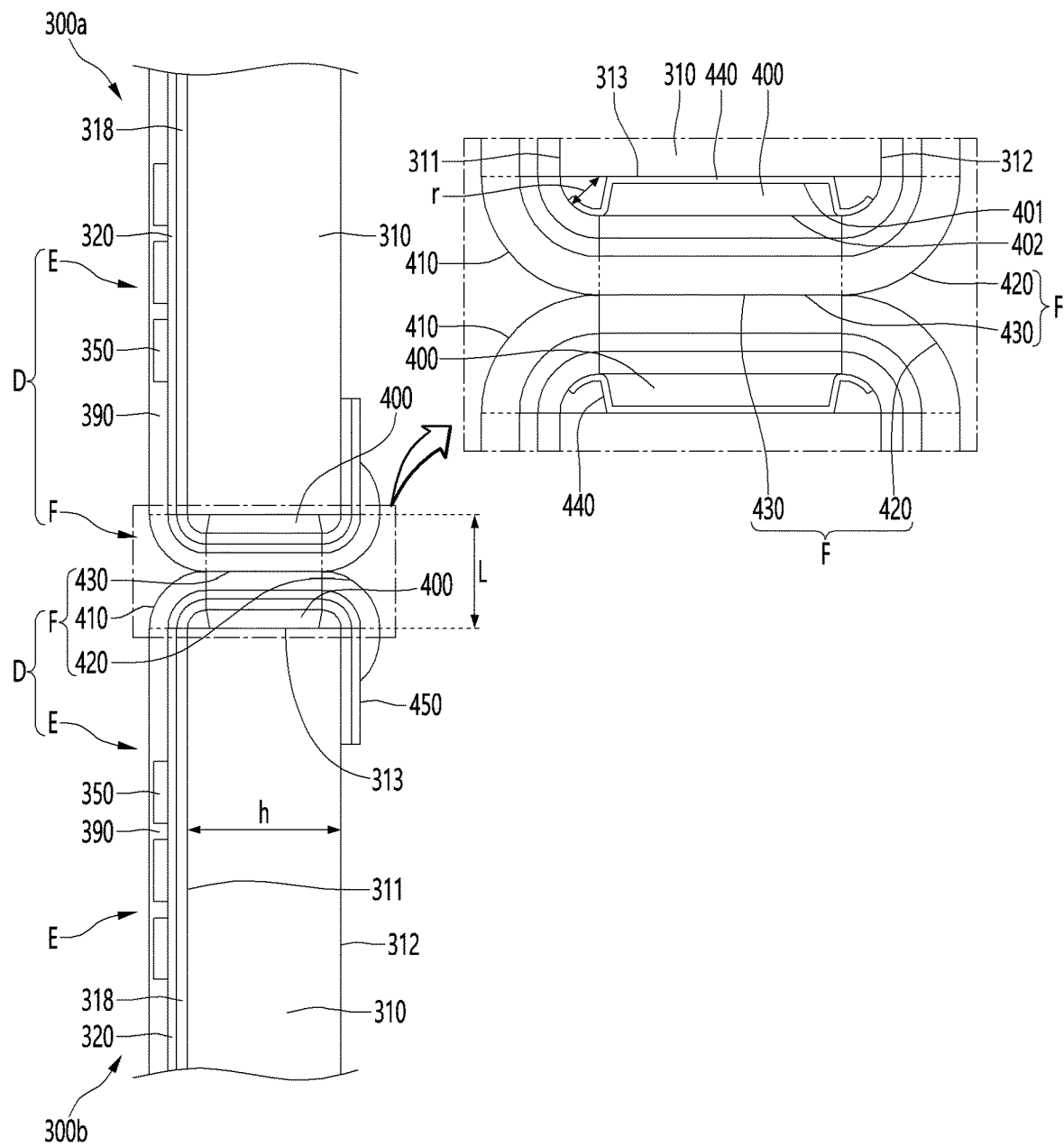

[FIG. 12]
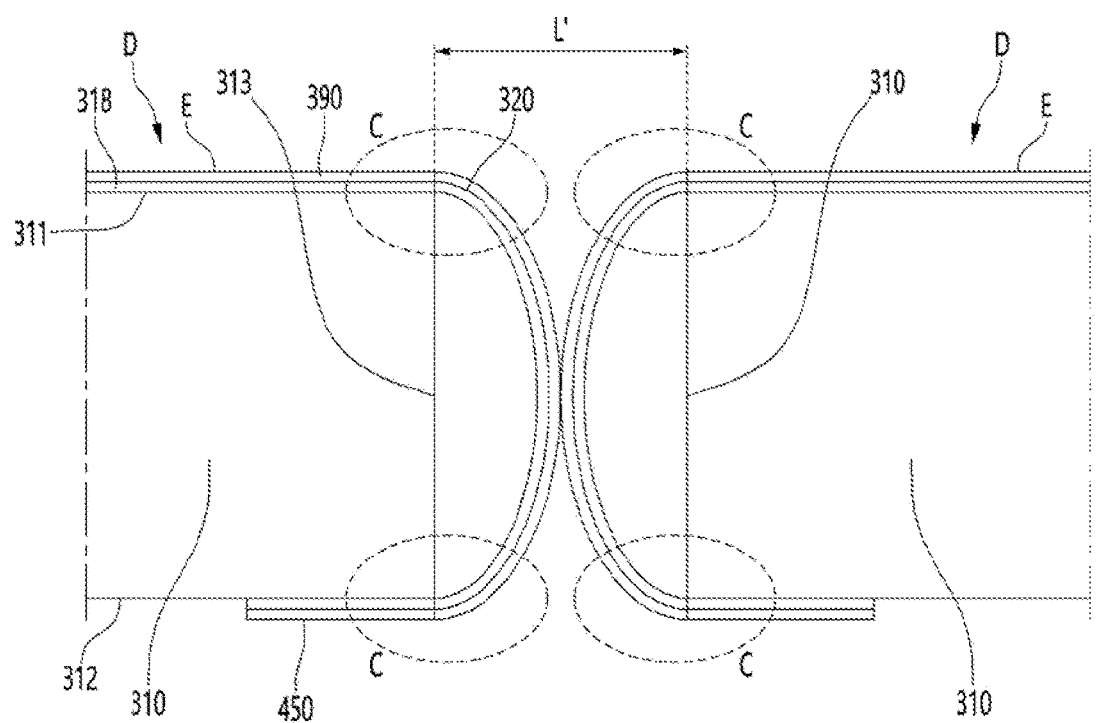

[FIG. 13]
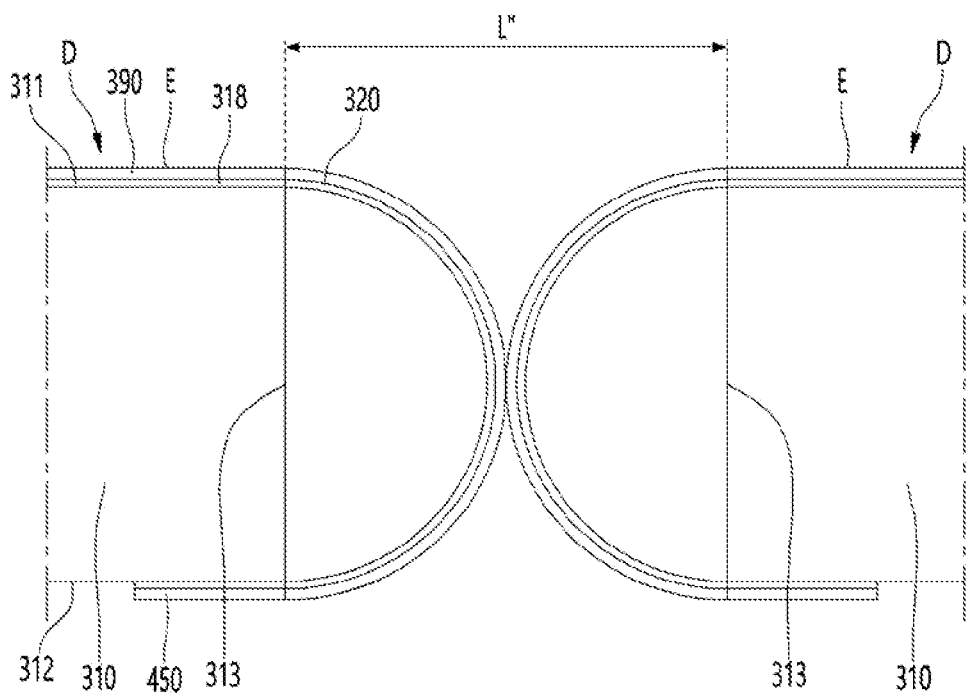

[FIG. 14]
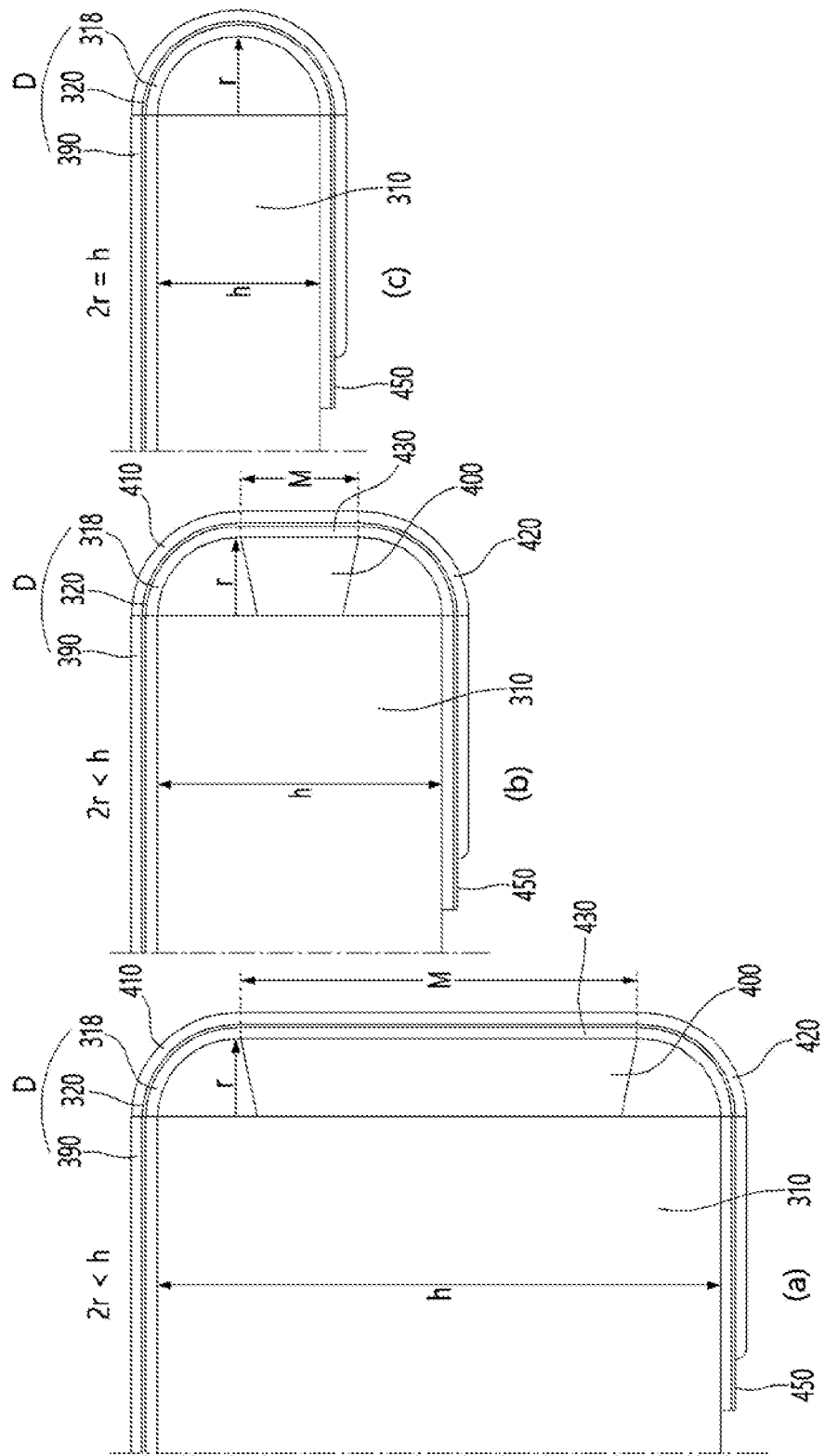

[FIG. 15]
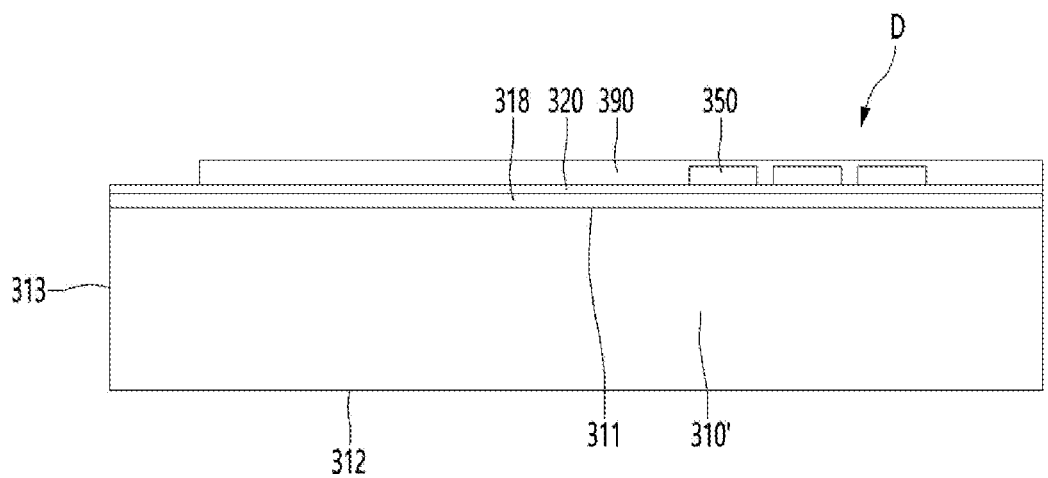
[FIG. 16]
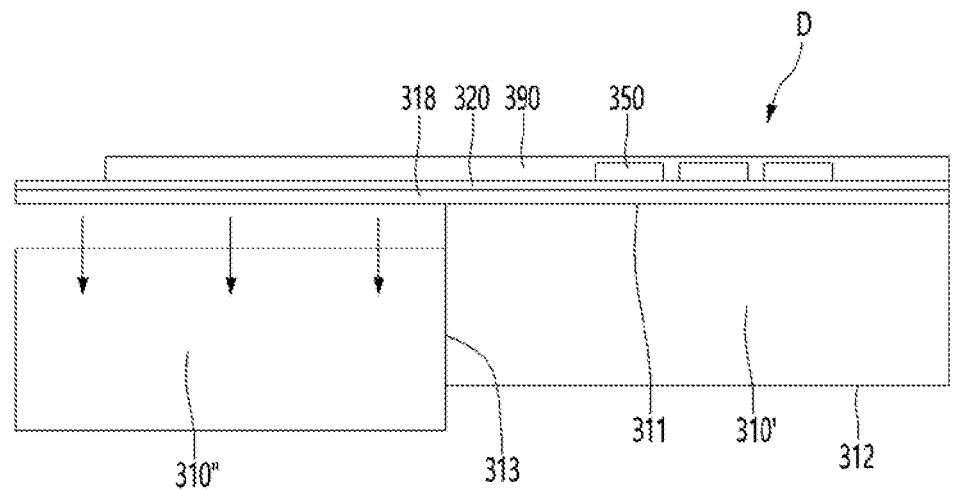

[FIG. 17]
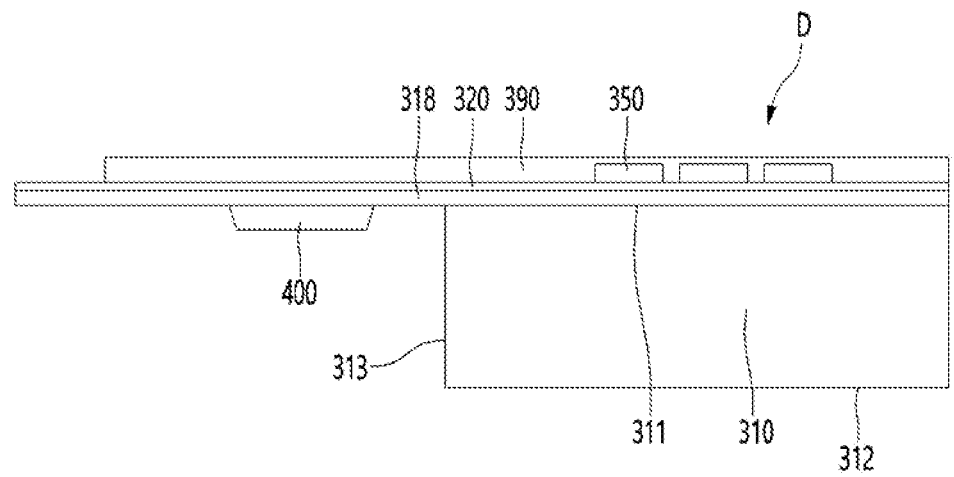
[FIG. 18]
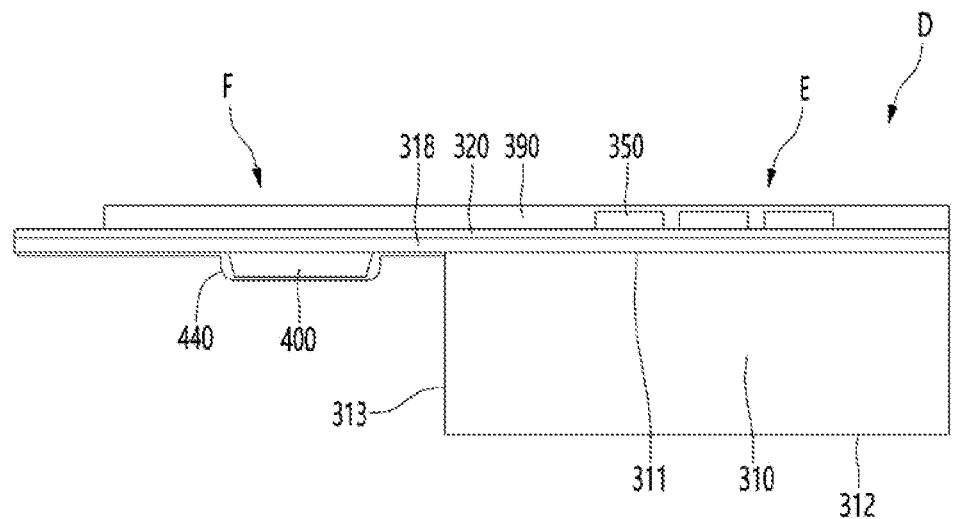

[Fig.19]
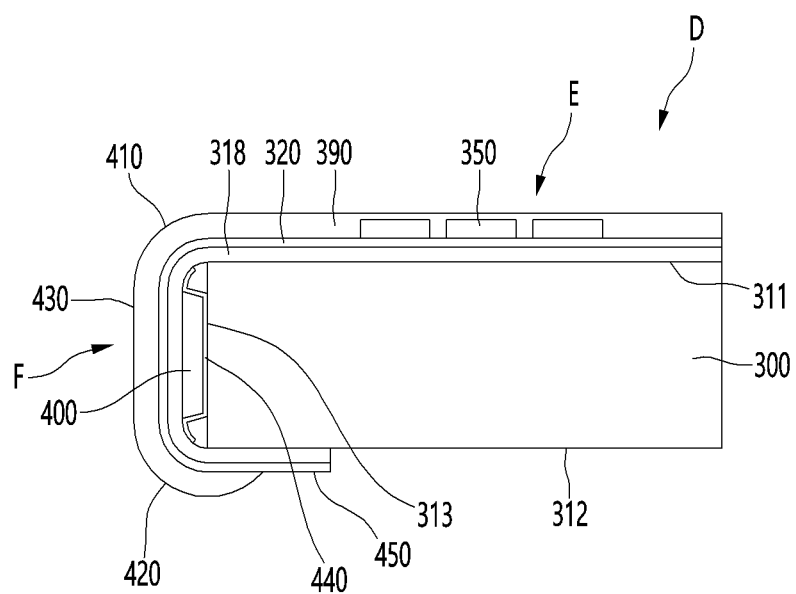

[FIG. 20]
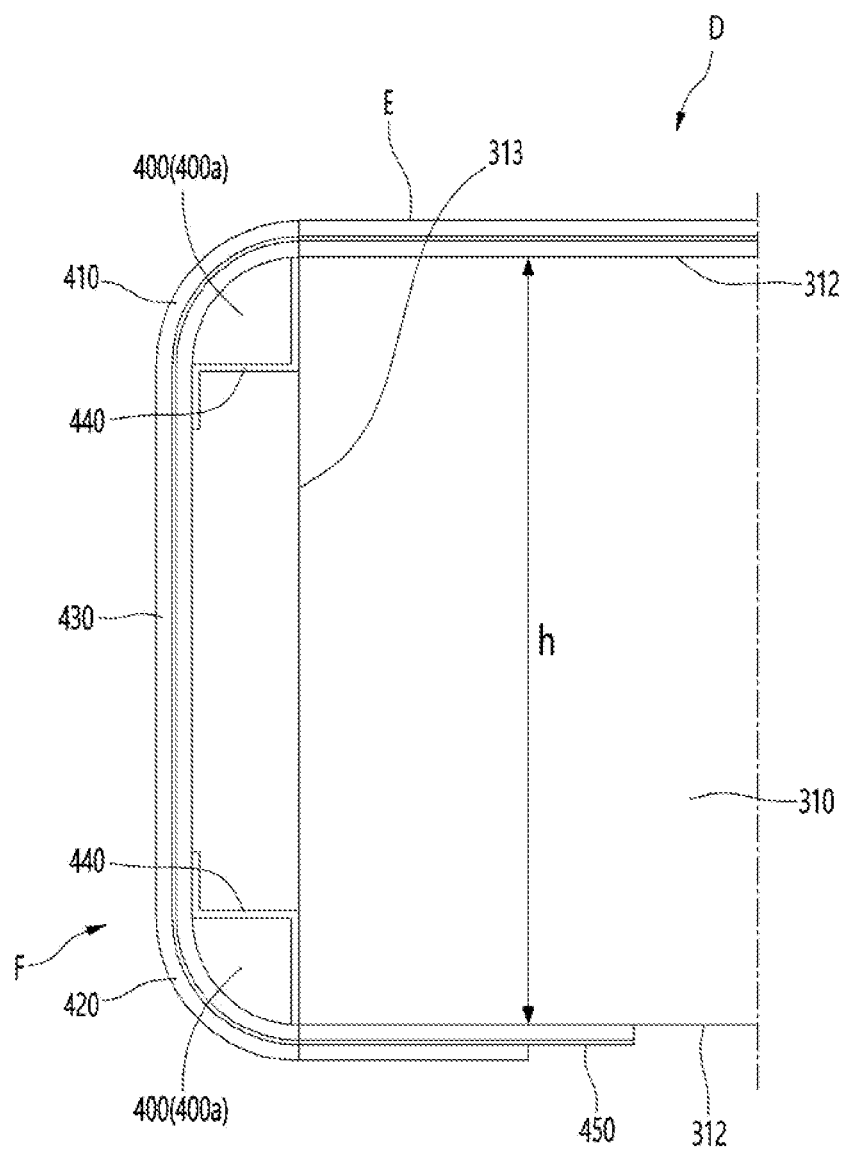

DISPLAY DEVICE HAVING SUPPORT MODULE ON SIDE SURFACE OF SUBSTRATE

CROSS-REFERENCE TO RELATED APPLICATIONS

This application is the National Phase of PCT International Application No. PCT/KR2020/010437 filed on Aug. 6, 2020, the disclosures of which are incorporated herein by reference in their entirety.

TECHNICAL FIELD

The present disclosure relates to a display.

BACKGROUND ART

Recently, display devices having excellent characteristics such as thinness and flexibility have been developed in the fields of the display technology.

Displays according to the related art are represented by liquid crystal displays (LCDs) and active matrix organic light emitting diodes (AMOLEDs).

However, in the case of the LCDs, there are limitations in that a response time is not fast, implement ion of flexibility is difficult, a lifespan is short in the case of AMOLEDs, and mass production yield is poor.

Light emitting diodes (LEDs) are well-known semiconductor light emitting elements that convert current into light. Beginning of the commercialization of red LEDs using GaAsP compound semiconductors in 1960, the light emitting diodes have been used as light sources for displaying images in electronic devices in addition to information communication devices together with GaP:N series green LEDs. A method for solving the above limitations by implementing a display using the semiconductor light emitting element may be proposed. The light emitting diodes have various advantages over filament-based light emitting elements, such as long lifespan, low power consumption, excellent initial drive characteristics, and high vibration resistance.

As an example of the display, Korean Patent Registration No. 10-1895217 (published on Sep. 7, 2018) discloses a tiling multi-display. The tiling multi-display includes a flexible panel including a pixel area on which pixels are formed and a bezel area formed on an edge portion of the pixel area, and support substrate to which the flexible panel is bonded. Here, the pixel area of the flexible panel is bonded to a top surface of the support substrate, and the bezel area of the flexible panel is folded to be bonded to a side surface, which is connected to the top surface, and a bottom surface of the support substrate. In addition, a curvature radius r of the folded portion of the flexible panel is less than ½ of a length S between the pixels.

As another example of the display, Korean Patent Publication No. 10-2017-0071047 A (published on Jun. 23, 2017) discloses a flexible display device. The flexible display device includes a substrate including a display area and a non-display area and having a bending area within the non-display area, a link line provided on the non-display area on the substrate, and a bending connection line provided on the bending area on the substrate and connected to the line through a contact hole. Here, the bending connection line is disposed at a neutral plane to reduce a size of the bezel, thereby improving aesthetics.

DISCLOSURE OF THE INVENTION

Technical Problem

The display device according to the related art has limitations in that the line electrode is damaged when the line electrode such as the bending connection line is excessively bent to increase in resistance and cause disconnection.

The display device according to the related art has limitations in that the non-display area increases when the line electrode is gently bent to prevent the line electrode from being disconnected, and thus, the bezel is enlarged in size.

Embodiments provide a display device having high reliability by minimizing a sharply bent portion and disconnection of a line electrode.

Embodiments also provide a display device in which a bezel is minimized through a simple structure.

Technical Solution

In one embodiment, a display device includes: a substrate; a display panel including a display disposed on a front surface of the substrate and a flexible base material extending from the display to surround a portion of each of a side surface and a rear surface of the substrate; and a support layer disposed between the side surface of the substrate and the flexible base material to support the flexible base material.

The flexible base material may include: a pair of curved portions spaced apart from the support layer; and a side cover portion that is configured to connect the pair of curved portions to each other and is in contact with the support layer.

The display panel may include: a flexible substrate that is in contact with the substrate; a line electrode disposed on the flexible substrate; a plurality of semiconductor light emitting elements disposed on the line electrode; and a protective layer configured to cover the line electrode and the plurality of semiconductor light emitting elements.

The side cover portion may be spaced apart from the side surface and be parallel to the side surface.

A curvature radius of each of the curved portions may be less than half of a thickness of the substrate.

A length of the support layer may be less than a length obtained by subtracting twice a curvature radius of each of the curved portions from a thickness of the substrate.

The support layer may be coated on the flexible base material.

The display device may further include an adhesive coated to the support layer and the flexible base material to adhere to the side surface of the substrate.

The support layer may include: a first surface configured to face the side surface of the substrate; and a second surface configured to face the flexible base material, wherein the second surface may have an area greater than that of the first surface.

The side surface of the substrate may be perpendicular to the front surface and the rear surface of the substrate.

In another embodiment, a display device includes a plurality of display modules disposed at a predetermined pitch, wherein each of the plurality of display modules includes: a substrate, a display panel, and a support layer, wherein a flexible base material of the display panel is in contact with the other display panel adjacent thereto.

In further another embodiment, a method for manufacturing a display device includes: forming a display panel on a front surface of a substrate; removing a portion of the substrate to expose a portion of a rear surface of the display panel; coating a support layer to the exposed rear surface of the display panel; coating an adhesive to the support layer and the display panel; and bending the display panel to be fixed to portions of a side surface and a rear surface of the substrate, wherein the display panel includes: a pair of curved portions spaced apart from the support layer; and a side cover portion that is configured to connect the pair of curved portions to each other and is in contact with the support layer.

The details of one or more embodiments are set forth in the accompanying drawings and the description below. Other features will be apparent from the description and drawings, and from the claims.

Advantageous Effects

According to the embodiment of the present disclosure, the sharp bending of the line electrode may be minimized to minimize the damage or disconnection of the line electrode.

In addition, the bezel between the plurality of display panels may be minimized, and the high resolution may be secured.

In addition, the flexible base material may be reliably held on the substrate by the support layer.

BRIEF DESCRIPTION OF THE DRAWINGS

FIG. 1 is a conceptual view showing an embodiment of a display using a semiconductor light emitting diode of the present disclosure.

FIG. 2 is a partial enlarged view of the part A of FIG. 1 and FIGS. 3A and 3B are cross-sectional views taken along line B-B and C-C of FIG. 2.

FIG. 4 is a conceptual view showing a flip-chip type semiconductor light emitting diode of FIG. 3.

FIGS. 5A to 5C are conceptual views showing various types that implement colors in relation to a flip-chip type semiconductor light emitting diode.

FIG. 6 shows cross-sectional views illustrating a method of manufacturing a display using a semiconductor light emitting diode of the present disclosure.

FIG. 7 is a perspective view showing another embodiment of a display using a semiconductor light emitting diode of the present disclosure.

FIG. 8 is a cross-sectional view taken along line D-D of FIG. 7.

FIG. 9 is a conceptual view showing a vertical semiconductor light emitting diode of FIG. 8.

FIG. 10 is a view of a display device according to an embodiment of the present disclosure.

FIG. 11 is an enlarged view of a part A of FIG. 10.

FIG. 12 is an enlarged view illustrating a first comparative example compared to an embodiment of the present disclosure.

FIG. 13 is an enlarged view illustrating a second comparative example compared to an embodiment of the present disclosure.

FIG. 14 is a view comparing a display panel according to an embodiment of the present disclosure with a comparative example.

FIG. 15 is a view showing a state in which a display panel is formed on a front surface of a substrate according to an embodiment of the present disclosure.

FIG. 16 is a view showing a process of removing a portion of the substrate of FIG. 15.

FIG. 17 is a view showing a process of coating a support layer on the display panel of FIG. 16.

FIG. 18 is a view showing a process of coating an adhesive to the support layer of FIG. 17.

FIG. 19 is a view showing a process of bending the display panel of FIG. 18.

FIG. 20 is a view showing a modified example according to an embodiment of the present disclosure.

BEST MODE FOR CARRYING OUT THE INVENTION

Hereinafter, detailed embodiments will be described in detail with reference to the accompanying drawings.

Hereafter, embodiments of the present disclosure will be described in detail with reference to the accompanying drawings and the same or similar components are given the same reference numerals regardless of the numbers of figures and are not repeatedly described. Terms "module" and "unit" that are used for components in the following description are used only for the convenience of description without having discriminate meanings or functions. In the following description, if it is decided that the detailed description of known technologies related to the present disclosure makes the subject matter of the embodiments described herein unclear, the detailed description is omitted. Further, it should be noted that the accompanying drawings are provided only for easy understanding of the embodiments disclosed herein and the spirit of the present disclosure should not be construed as being limited to the accompanying drawings.

When an element such as a layer, a region, or a substrate is referred to as being "on," another element, it may be directly on the other element, or an intervening element may be present therebetween.

A display described herein may include a mobile phone, a smart phone, a laptop computer, a digital broadcasting terminal, a PDA (personal digital assistants), a PMP (portable multimedia player), a navigation, a slate PC, a tablet PC, a ultra book, a digital TV, a desktop computer, etc. However, it would be easily understood by those skilled in the art that the configuration according to embodiments described here may be applied to devices that can be equipped with a display, even if the devices are new types of products that will be developed in future.

Before an assembly apparatus for assembling a semiconductor light emitting diode to a display panel (substrate) according to an embodiment of the present disclosure is described, a semiconductor light emitting diode and a display using the semiconductor light emitting diode are described.

FIG. 1 is a conceptual diagram showing an embodiment of a display using a semiconductor light emitting diode of the present disclosure.

Referring to the figure, information that is processed by a controller of a display 100 can be displayed using a flexible display.

The flexible display includes displays that can be bent, curved, twisted, folded, and rolled by external force. For example, the flexible display may be a display that is manufactured on a thin and flexible substrate, which can be bent, curved, folded, or rolled like paper, while maintaining the display characteristics of existing flat panel display.

In a state in which the flexible display is not bent (e.g., in which the flexible display has an infinite radius of curvature, which is referred to as a 'first state' hereafter), the display region of the flexible display becomes a flat surface. In a state in which the flexible display is bent from the first state by external force (e.g., in which the flexible display has a finite radius of curvature, which is referred to as a 'second state' hereafter), the display region may be a curved surface. As shown in the figure, the information that is displayed in the second state may be visual information that is output on the curved surface. Such visual information is implemented by individual control of light emission of sub-pixels disposed in a matrix type. The sub-pixel means a minimum unit for implementing one color.

The sub-pixels of the flexible display can be implemented by a semiconductor light emitting diode. A light emitting diode (LED) that is a kind of semiconductor light emitting diode converting a current into light is exemplified in the present disclosure. The light emitting diode is formed in a small size, so it can function as a sub-pixel even in the second state.

Hereafter, a flexible display implemented using the light emitting diode is described in more detail with reference to drawings.

FIG. 2 is a partial enlarged view of the portion A of FIG. 1, FIGS. 3A and 3B are cross-sectional views taken along lines B-B and C-C of FIG. 2, FIG. 4 is a conceptual view showing a flip-chip type semiconductor light emitting diode of FIG. 3, and FIGS. 5A to 5C are conceptual views showing various types that implement colors in relation to a flip-chip type semiconductor light emitting diode.

According to FIGS. 2, 3A, and 3B, as a display 100 using a semiconductor light emitting diode, a display 100 using a passive matrix (PM) type of semiconductor light emitting diode is exemplified. However, examples to be described hereafter can be applied also to an active matrix (AM) type of semiconductor light emitting diode.

The display 100 includes a first substrate 110, a first electrode 120, a conductive adhesive layer 130, a second electrode 140, and a plurality of semiconductor light emitting diodes 150.

The substrate 110 may be a flexible substrate. For example, the substrate 110 may include glass or polyimide (PI) to implement a flexible display. Further, any materials may be used as long as they have insulation and flexibility such as PEN (Polyethylene Naphthalate) and PET (Polyethylene Terephthalate). Further, the substrate 110 may be made of any one of a transparent material or an opaque material.

The substrate 110 may be a wiring board on which the first electrode 120 is disposed, so the first electrode 120 may be positioned on the substrate 110.

According to the drawings, an insulating layer 160 may be disposed over the substrate 110 on which the first electrode 120 is positioned, and an auxiliary electrode 170 may be positioned on the insulating layer 160. In this case, the state in which the insulating layer 160 is stacked on the substrate 110 may be one wiring board. In more detail, the insulating layer 160 may be made of an insulating and flexible material, such as PI (Polyimide), PET, and PEN, integrally with the substrate 110, thereby forming one substrate.

The auxiliary electrode 170, which is an electrode electrically connecting the semiconductor light emitting diodes 150, is positioned on the insulating layer 160 and disposed to correspond to the first electrode 120. For example, the auxiliary electrode 170 has a dot shape and can be electrically connected with the first electrode 120 by electrode holes 171 formed through the insulating layer 160. The electrode hole 171 may be formed by filing a via hole with a conductive material.

Referring to the figures, the conductive adhesive layer 130 is formed on a surface of the insulating layer 160, but the present disclosure is not necessarily limited thereto. For example, a structure, in which a layer performing a specific function is formed between the insulating layer 160 and the conductive adhesive layer 130 or the conductive adhesive layer 130 is disposed on the substrate 110 without the insulating layer 160, is possible. In the structure in which the conductive adhesive layer 130 is disposed on the substrate 110, the conductive adhesive layer 130 can function as an insulating layer.

The conductive adhesive layer 130 may be a layer having an adhesive property and conductivity, and to this end, a substance having conductivity and a substance having an adhesive property may be mixed in the conductive adhesive layer 130. Further, the conductive adhesive layer 130 has ductility, so it enables the flexible function of the display.

As an example of this case, the conductive adhesive layer 130 may be an anisotropy conductive film (ACF), an anisotropy conductive paste, and a solution containing conductive particles. The conductive adhesive layer 130 may be configured as a layer that allows for electrical connection in a Z direction passing through the thickness, but has electrical insulation in the horizontal X-Y direction. Accordingly, the conductive adhesive layer 130 may be referred to as a Z-axial conductive layer (however, hereafter, referred to as a 'conductive adhesive layer').

The anisotropic conductive film is a film in which an anisotropic conductive medium is mixed in an insulating base member, and only a specific portion is given conductivity by the anisotropic conductive medium when heat and pressure are applied. It is assumed in the following description that heat and pressure are applied to the anisotropic conductive film, but other methods are also possible so that the anisotropic conductive film partially has conductivity. These methods, for example, may be a case of applying only any one of heat and pressure or a case of UV curing.

Further, the anisotropic conductive medium, for example, may be a conductive ball or a conductive particle. According to the figures, in this embodiment, the anisotropic conductive film is a film in which conductive balls are mixed in an insulating base member, and only a specific portion is given conductivity by the conductive balls when heat and pressure are applied. The anisotropic conductive film may be in a state in which a plurality of particles coated with an insulating film made of a polymer material is contained in a core made of a conductive substance, and in this case, when heat and pressure are applied a portion, the insulating film is broken at the portion and the portion is given conductivity by the core. In this case, the shape of the core is deformed, so layers that are in contact with each other in the thickness direction of the film may be formed. As a more detailed example, heat and pressure are applied throughout the anisotropic conductive film and Z-axial electrical connection is partially formed by the height difference of an object that is bonded by the anisotropic conductive film.

As another example, the anisotropic conductive film may be in a state in which a plurality of particles coated with a conductive substance is contained in an insulating core. In this case, when heat and pressure are applied to a portion, the conductive substance at the portion is deformed (gets scored and sticks), so the portion is given conductivity in the thickness direction of the film. As another example, the conductive substance may pass through the insulating base member in the Z-axial direction to show conductivity in the thickness direction of the film. In this case, the conductive substance may have a pointed end.

According to the figures, the anisotropic conductive film may be a fixed array ACF in which conductive balls are inserted in a surface of an insulating base member. In more detail, the insulating base member is made of an adhesive substance, the conductive balls are concentrated at the bottom of the insulating base member, and when heat and pressure are applied to the base member, the base member is deformed with the conductive balls, thereby being given vertical conductivity.

However, the present disclosure is not limited thereto, and the anisotropic conductive film may be configured in a type in which conductive balls are randomly mixed in an insulating base member or a type in which a plurality of layers is provided and conductive balls are disposed in any one layer (double-ACF).

The anisotropic conductive paste is formed by combining a paste and conductive balls, and may be a paste in which conductive balls are mixed in an insulating and adhesive base substance. Further, the solution containing conductive particles may be a solution containing conductive particles or nano particles.

Referring to figures again, the second electrode 140 is spaced apart from the auxiliary electrode 170 and positioned on the insulating layer 160. That is, the conductive adhesive layer 130 is disposed on the insulating layer 160 on which the auxiliary electrode 170 and the second electrode 140 are positioned.

When the conductive adhesive layer 130 is formed in a state in which the auxiliary electrode 170 and the second electrode 140 are positioned on the insulating layer 160, and then the semiconductor light emitting diode 150 is connected in a flip-chip type by applying heat and pressure, the semiconductor light emitting diode 150 is electrically connected with the first electrode 120 and the second electrode 140.

Referring to FIG. 4, the semiconductor light emitting diode may be a flip-chip type light emitting diode.

For example, the semiconductor light emitting diode includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 horizontally spaced apart from the p-type electrode 156 on the n-type semiconductor layer 153. In this case, the p-type electrode 156 can be electrically connected with the auxiliary electrode 170 by the conductive adhesive layer 130, and the n-type electrode 152 can be electrically connected with the second electrode 140.

Referring to FIGS. 2, 3A, and 3B again, the auxiliary electrode 170 is elongated in one direction and at least one auxiliary electrode can be electrically connected with a plurality of semiconductor light emitting diodes 150. For example, the p-type electrodes of semiconductor light emitting diodes at left and right sides from an auxiliary electrode can be electrically connected with one auxiliary electrode.

In more detail, the semiconductor light emitting diode 150 is pressed into the conductive adhesive layer 130 by heat and pressure, so only the portion between the p-type electrode 156 of the semiconductor light emitting diode 150 and the auxiliary electrode 170 and the portion between the n-type electrode 152 of the semiconductor light emitting diode 150 and the second electrode 140 have conductivity, and the other portions do not have conductivity because the semiconductor light emitting diode is pressed inside. As described above, the conductive adhesive layer 130 not only couples, but also electrically connects the portion between the semiconductor light emitting diode 150 and the auxiliary electrode 170 and the portion between the semiconductor light emitting diode 150 and the second electrode 140.

Further, the plurality of semiconductor light emitting diodes 150 constitutes a light emitting diode array, and a fluorescent layer 180 is formed on the light emitting diode array.

The light emitting diode array may include a plurality of semiconductor light emitting diodes having different own luminance values. Each of the semiconductor light emitting diode 150 constitutes a sub-pixel and is electrically connected to the first electrode 120. For example, the first electrode 120 may be a plurality of pieces, the semiconductor light emitting diodes, for example, may be arranged in several lines, and the semiconductor light emitting diodes in each line may be electrically connected to any one of the plurality of first electrodes.

Further, since the semiconductor light emitting diodes are connected in a flip-chip type, it is possible to use grown semiconductor light emitting diodes for a transparent dielectric substrate. Further, the semiconductor light emitting diodes, for example, may be nitride semiconductor light emitting diodes. Since the semiconductor light emitting diode 150 has excellent luminance, it can constitute an individual sub-pixel even in a small size.

According to the figures, a separation wall 190 may be formed between the semiconductor light emitting diodes 150. In this case, the separation wall 190 can serve to separate individual sub-pixels and may be formed integrally with the conductive adhesive layer 130. For example, the semiconductor light emitting diodes 150 are inserted in the anisotropic conductive film, the base member of the anisotropic conductive film can form the separation wall.

Further, when the base member of the anisotropic conductive film is black, the separation wall 190 can have a reflective characteristic and the contrast can be increased even without a discrete black insulator.

As another example, a reflective separation wall may be provided as the separation wall 190. In this case, the separation wall 190 may include a black or white insulator, depending on the object of the display. When a separation wall of a white insulator is used, there can be an effect of increasing reflectivity, and when a separation wall of a black insulator, it is possible to have a reflective characteristic and increase contrast.

The fluorescent layer 180 may be positioned on the outer side of the semiconductor light emitting diode 150. For example, the semiconductor light emitting diode 150 is a blue semiconductor light emitting diode that emits blue light (B), and the fluorescent layer 180 performs a function of converting the blue light (B) into a color of a sub-pixel. The fluorescent layer 180 may be a red fluorescent body 181 or a green fluorescent body 182 that constitutes an individual pixel.

That is, the red fluorescent body 181 that can convert blue light into red light (R) may be stacked on a blue semiconductor light emitting diode at a position where a red sub-pixel is formed, and the green fluorescent body 182 that can convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels can form one pixel. In more detail, a fluorescent body having one color may be stacked along each line of the first electrode 120. Accordingly, in the first electrode 120, one line may be an electrode that controls one color. That is, red (R), green (G), and blue (B) may be sequentially disposed along the second electrode 140, whereby a sub-pixel can be implemented.

However, the present disclosure is not necessarily limited thereto, and red (R), green (G), and blue (B) sub-pixels may be implemented by combining the semiconductor light emitting diode 150 and a quantum dot (QD) instead of a fluorescent body.

Further, a black matrix 191 may be disposed between each of fluorescent bodies to improve contrast. That is, the black matrix 191 can improve the contrast of light and darkness.

However, the present disclosure is not necessarily limited thereto and another structure may be applied to implement blue, red, and green.

Referring to FIG. 5A, the semiconductor light emitting diodes 150 each may be implemented as a high-power light emitting diodes in which gallium nitride (GaN) is included as a main component and indium (In) and/or aluminum (Al) is added to emit various colors of light including blue.

In this case, the semiconductor light emitting diodes 150 may be red, green, and blue semiconductor light emitting diodes to from sub-pixels respectively. For example, red, green, and blue semiconductor light emitting diodes (R, G, B) are alternately disposed, and sub-pixels of red, green, and blue constitute one pixel by the red, green, and blue semiconductor light emitting diodes, whereby a full-color display can be implemented.

Referring to FIG. 5B, the semiconductor light emitting diode may have white light emitting diodes (W) each having a yellow fluorescent layer. In this case, in order to form a sub-pixel, a red fluorescent layer 181, a green fluorescent layer 182, and a blue fluorescent layer 183 may be disposed on the white light emitting diode (W). Further, a sub-pixel may be formed using a color filter in which red, green, and blue are repeated, on the white light emitting diode (W).

Referring to FIG. 5C, a structure in which a red fluorescent layer 181, a green fluorescent layer 182, and a blue fluorescent layer 183 are disposed on an ultraviolet light emitting diode (UV) may be possible. As described above, a semiconductor light emitting diode can be used in the entire region including not only the visual light, but also ultraviolet light (UV), and can be expanded in the type of a semiconductor light emitting diode that can use ultraviolet light (UV) as an excitation source of an upper fluorescent body.

Referring to this embodiment again, the semiconductor light emitting diode 150 is positioned on the conductive adhesive layer 130, thereby constituting a sub-pixel in the display. Since the semiconductor light emitting diode 150 has excellent luminance, it can constitute an individual sub-pixel even in a small size. The individual semiconductor light emitting diode 150 may have a size with one side of 80 μm or less and may be a rectangular or a square diode. When it is a rectangle, the size may be 20×80 μm or less.

Further, even using a square semiconductor light emitting diode 150 having one side length of 10 μm as a sub-pixel, sufficient brightness for forming a display is shown. Accordingly, for example, in a case in which the size of a sub-pixel is a rectangular pixel having one side of 600 μm and the other one side of 300 μm, the distance of a semiconductor light emitting diode is relatively sufficiently large. Accordingly, in this case, it is possible to implement a flexible display having high quality over HD quality.

The display using the semiconductor light emitting diode described above can be manufactured by a new type of manufacturing method. Hereafter, this manufacturing method is described with reference to FIG. 6.

FIG. 6 shows cross-sectional views illustrating a method of manufacturing a display using a semiconductor light emitting diode of the present disclosure.

Referring to this figure, first, the conductive adhesive layer 130 is formed on the insulating layer 160 on which the auxiliary electrode 170 and the second electrode 140 are positioned. The insulating layer 160 is stacked on the first substrate 110, thereby forming one substrate (wiring board). Further, the first electrode 120, the auxiliary electrode 170, and the second electrode 140 are disposed on the wiring board. In this case, the first electrode 120 and the second electrode 140 may be disposed perpendicular to each other. Further, in order to implement a flexible display, the first substrate 110 and the insulating layer 160 each may include glass or polyimide (PI).

The conductive adhesive layer 130, for example, may be implemented by an anisotropic conductive film, and to this end, an anisotropic conductive film may be applied to a substrate on which the insulating layer 160 is positioned.

Next, a second substrate 112 on which a plurality of semiconductor light emitting diodes 150, which correspond to the positions of the auxiliary electrodes 170 and the second electrodes 140 and constitute individual pixels, is positioned is disposed such that the semiconductor light emitting diodes 150 face the auxiliary electrodes 170 and the second electrodes 140.

In this case, the second substrate 112, which is a growing substrate for growing the semiconductor light emitting diodes 150, may be a spire substrate or a silicon substrate.

The semiconductor light emitting diodes have a gap and a size that can form a display when they are formed in a wafer unit, so they can be effectively used for a display.

Next, the wiring board and the second substrate 112 are thermally pressed. For example, the wiring board and the second substrate 112 can be thermally pressed using an ACF press head. The wiring board and the second substrate 112 are bonded by the thermal pressing. Only the portions among the semiconductor light emitting diode 150, the auxiliary electrode 170, and the second electrode 140 have conductivity by the characteristics of an anisotropic conductive film having conductivity by thermal pressing, so the electrodes and the semiconductor light emitting diodes 150 can be electrically connected. In this case, the semiconductor light emitting diodes 150 are inserted in the anisotropic conductive film, so separation walls may be formed between the semiconductor light emitting diodes 150.

Next, the second substrate 112 is removed. For example, it is possible to remove the second substrate 112 using Laser Lift-off (LLO) or Chemical Lift-off (CLO).

Finally, the semiconductor light emitting diodes 150 are exposed to the outside by removing the second substrate 112. If necessary, it is possible to form a transparent insulating layer (not shown) by coating the top of the wiring board, to which the semiconductor light emitting diodes 150 are coupled, with silicon oxide (SiOx), etc.

Further, a step of forming a fluorescent layer on a surface of the semiconductor light emitting diode 150 may be further included. For example, the semiconductor light emitting diode 150 may be a blue semiconductor light emitting diode that emits blue light (B), and a red fluorescent body or a green fluorescent body for converting the blue light (B) into the light of a sub-pixel may form a layer on a surface of the blue semiconductor light emitting diode.

The manufacturing method or structure of the display using a semiconductor light emitting diode described above can be modified in various ways. As an example, a vertical semiconductor light emitting diode can also be applied to the display described above. Hereafter, a vertical structure is described with reference to FIGS. 5 and 6.

Further, in the modification or embodiment to be described hereafter, the same or similar components are given the same or similar reference numerals, and the above description is referred to for the description.

FIG. 7 is a perspective view showing another embodiment of a display using a semiconductor light emitting diode of the present disclosure, FIG. 8 is a cross-sectional view taken along line D-D of FIG. 7, and FIG. 9 is a conceptual view showing a vertical semiconductor light emitting diode of FIG. 8.

Referring to these figures, the display may be a display that uses passive matrix (PM) type of vertical semiconductor light emitting diodes.

The display includes a substrate 210, a first electrode 220, a conductive adhesive layer 230, a second electrode 240, and a plurality of semiconductor light emitting diodes 250.

The substrate 210, which is a wiring board on which the first electrode 220 is disposed, may include polyimide (PI) to implement a flexible display. Further, any materials may be used as long as they have insulation and flexibility.

The first electrode 220 is positioned on the substrate 210 and may be formed in a bar shape that is long in one direction. The first electrode 220 may be configured to function as a data electrode.

The conductive adhesive layer 230 is formed on the substrate 210 on which the first electrode 220 is positioned. Like a display to which flip-chip type light emitting diodes are applied, the conductive adhesive layer 230 may be an anisotropy conductive film (ACF), an anisotropy conductive paste, and a solution including conductive particles. However, in this embodiment, a case in which the conductive adhesive layer 230 is implemented by an anisotropic conductive film is exemplified.

An isotropic conductive film is positioned in a state in which the first electrode 220 is positioned on the substrate 210 and then the semiconductor light emitting diode 250 is connected by applying heat and pressure, the semiconductor light emitting diode 250 is electrically connected with the first electrode 220. In this case, it is preferable that the semiconductor light emitting diode 250 is disposed to be positioned on the first electrode 220.

The electrical connection, as described above, is generated because when heat and pressure are applied, the anisotropic conductive film partially has conductivity in the thickness direction. Accordingly, the anisotropic conductive film is divided into a portion having conductivity in the thickness direction and a portion not having conductivity in the thickness direction.

Further, since the anisotropic conductive film contains an adhesive component, the conductive adhesive layer 230 implements not only electrical connection, but also mechanical coupling between the semiconductor light emitting diode 250 and the first electrode 220.

As described above, the semiconductor light emitting diode 250 is positioned on the conductive adhesive layer 230, whereby it configures an individual pixel in the display. Since the semiconductor light emitting diode 250 has excellent luminance, it can constitute an individual sub-pixel even in a small size. The individual semiconductor light emitting diode 250 may have a size with one side of 80 μm or less and may be a rectangular or a square diode. When it is a rectangle, the size may be 20×80 μm or less.

The semiconductor light emitting diode 250 may be a vertical structure.

A plurality of second electrodes 240 disposed across the length direction of the first electrode 220 and electrically connected with the vertical semiconductor light emitting diodes 250 is positioned between the vertical semiconductor light emitting diodes.

Referring to FIG. 9, the vertical semiconductor light emitting diodes include a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 positioned at a lower portion can be electrically connected with the first electrode 220 by the conductive adhesive layer 230, and the n-type electrode 252 positioned at an upper portion can be electrically connected with the second electrode 240 to be described below. The semiconductor light emitting diode 250 has a large advantage in that electrodes can be disposed up and down, so the chip size can be reduced.

Referring to FIG. 8 again, a fluorescent layer 280 may be formed on a surface of the semiconductor light emitting diode 250. For example, the semiconductor light emitting diode 250 is a blue semiconductor light emitting diode 251 that emits blue light (B), and the fluorescent layer 280 for converting the blue light (B) into a color of a sub-pixel can be provided. In this case, the fluorescent layer 280 may be a red fluorescent 281 and a green fluorescent body 282 constituting an individual pixel.

That is, the red fluorescent body 281 that can convert blue light into red light (R) may be stacked on a blue semiconductor light emitting diode at a position where a red sub-pixel is formed, and the green fluorescent body 282 that can convert blue light into green light (G) may be stacked on a blue semiconductor light emitting diode at a position where a green sub-pixel is formed. Further, only a blue semiconductor light emitting diode may be independently used a portion forming a blue sub-pixel. In this case, red (R), green (G), and blue (B) sub-pixels can form one pixel.

However, the present disclosure is not necessarily limited thereto and other structures for implementing blue, green, and red, as described above, in a display to which flip-chip type light emitting diodes are applied may be applied.

According to this embodiment, the second electrodes 240 are disposed between the semiconductor light emitting diodes 250 and electrically connected with the semiconductor light emitting diodes. For example, the semiconductor light emitting diodes 250 may be disposed in a plurality of lines and the second electrodes 240 may be positioned between the lines of the semiconductor light emitting diodes 250.

Since the distance between the semiconductor light emitting diodes 250 that form individual pixels is sufficiently large, the second electrodes 240 can be positioned between the semiconductor light emitting diodes 250.

The second electrode 240 may be formed as an electrode in a bar shape that is long in one direction and may be disposed perpendicular to the first electrode.

Further, the second electrode 240 and the semiconductor light emitting diode 250 can be electrically connected by a connection electrode protruding from the second electrode 240. In more detail, the connection electrode may be the n-type electrode of the semiconductor light emitting diode 250. For example, the n-type electrode is formed as an ohmic electrode for ohmic contact and the second electrode covers at least a portion of the ohmic electrode by printing or depositing. Accordingly, the second electrode 240 and the n-type electrode of the semiconductor light emitting diode 250 can be electrically connected.

According to the figures, the second electrode 240 may be positioned on the conductive adhesive layer 230. Depending on cases, a transparent insulating layer (not shown) including silicon oxide (SiOx), etc. may be formed on the substrate 210 on which the semiconductor light emitting diodes 250 are formed. When the second electrode 240 is positioned after the transparent insulating layer is formed, the second electrode 240 is positioned on the transparent insulating layer. Further, the second electrodes 240 may be formed to be spaced apart from each other on the conductive adhesive layer 230 or the transparent insulating layer.

If a transparent electrode such as ITO (Indium Tin Oxide) is used to position the second electrode 240 on the semiconductor light emitting diode 250, there is a problem in that the ITO substance is not bonded well to a semiconductor layer. Accordingly, the present disclosure has the advantage that there is no need for using a transparent electrode such as ITO by positioning the second electrode 240 between the semiconductor light emitting diodes 250. Accordingly, it is possible to improve optical extraction efficiency by using a conductive substance, which is bonded well to an n-type semiconductor layer, as a horizontal electrode without being limited to selection of a transparent material.

According to the figures, a separation wall 290 may be positioned between the semiconductor light emitting diodes 250. That is, the separation wall 290 may be disposed between the vertical semiconductor light emitting diodes 250 to isolate the semiconductor light emitting diodes 250 forming individual pixels. In this case, the separation wall 290 can serve to separate individual sub-pixels and may be formed integrally with the conductive adhesive layer 230. For example, the semiconductor light emitting diodes 250 are inserted in the anisotropic conductive film, the base member of the anisotropic conductive film can form the separation wall.

Further, when the base member of the anisotropic conductive film is black, the separation wall 290 can have a reflective characteristic and the contrast can be increased even without a discrete black insulator.

As another example, a reflective separation wall may be provided as the separation wall 190. The separation wall 290 may include a black or white insulator, depending on the object of the display.

If the second electrode 240 is positioned directly on the conductive adhesive layer 230 between the semiconductor light emitting diodes 250, the separation wall 290 may be positioned between each of the semiconductor light emitting diodes 250 and the second electrodes 240. Accordingly, there is an effect that it is possible to configure individual sub-pixels even in a small size using the semiconductor light emitting diodes 250, it is possible to position the second electrode 240 between the semiconductor light emitting diodes 250 because the distance of the semiconductor light emitting diodes 250 is relatively larger, and it is possible to implement a flexible display having HD quality.

Further, according to the figures, a black matrix 291 may be disposed between fluorescent bodies to improve contrast. That is, the black matrix 291 can improve the contrast of light and darkness.

As described above, the semiconductor light emitting diode 250 is positioned on the conductive adhesive layer 230, whereby it configures an individual pixel in the display. Since the semiconductor light emitting diode 250 has excellent luminance, it can constitute an individual sub-pixel even in a small size. Accordingly, a full-color display in which red (R), green (G), and blue (B) sub-pixels form one pixel by semiconductor light emitting diodes can be implemented.

FIG. 10 is a view of a display device according to an embodiment of the present disclosure, FIG. 11 is an enlarged view of a part A of FIG. 10, and FIG. 12 is an enlarged view illustrating a first comparative example compared to an embodiment of the present disclosure. FIG. 13 is an enlarged view illustrating a second comparative example compared to an embodiment of the present disclosure.

A display device may include a substrate 310, a display panel D, and a support layer 400.

The substrate 310, the display panel D, and the support layer 400 may constitute a display module 300.

The display module 300 may be an assembly of a plurality of members, and for example, the display module 300 may include a micro LED display (LDM), a passive-matrix OLED (PMOLED), an active-matrix OLED (PMOLED), or a quantum dot LED (QLED).

The display device may include a plurality of display modules 300. In the display device, 4, 9, or 16 display modules 300 may be assembled.

The plurality of display modules 300 may be arranged to be close to each other. The plurality of display modules 300 may be arranged in multiple rows in a vertical direction and in multiple columns in a left and right direction.

The plurality of display modules 300 may be unit displays 300a and 300b. The plurality of display modules 300 will be described as including a first unit display 300a and a second unit display 300b, which are disposed to be close to each other. Hereinafter, a common constitution of the first unit display 300a and the second unit display 300b will be described to be referred to as the display module 300.

Each of the plurality of display modules 300 may include a substrate 310, a display panel D, and a support layer 400.

The substrate 310 may be a base substrate on which the display panel D is disposed. The substrate 310 may be a support substrate supporting the display panel D.

The substrate 310 may be made of a flexible material or a rigid material. An example of the substrate 310 may include a glass substrate. The substrate 310 is not limited to the glass substrate and may be made of plastic or the like.

The substrate 310 may be a rectangular parallelepiped shape, a front surface 311 of the substrate 310 may face a front side, and a rear surface 312 of the substrate 310 may face a rear side.

The substrate 310 may have a plate body shape having a predetermined thickness, and the front surface 311 and the rear surface 312 may be connected to each other by a circumferential surface 313.

The circumferential surface 313 of the substrate 310 may be a circuit edge of the substrate 310, and the circumferential surface 313 of the substrate 310 may be defined as a surface except for the front surface 311 and the rear surface 312 of the substrate 310.

Hereinafter, the circumferential surface 313 of the substrate 310 may be described to be referred to as a side surface 313 of the substrate 310, and the circumferential surface of the substrate 310 and the side surface of the substrate 310 will be described using the same reference numeral.

The side surface 313 of the substrate 310 may have a flat shape rather than a curved shape. The side surface 313 of the substrate 310 may be perpendicular to the front surface 311 of the substrate 310 and the rear surface 312 of the substrate 310.

The display panel D may be provided as an assembly of a plurality of members. The display panel D may include a plurality of pixels 350. Each of the plurality of pixels 350 may be a combination of red (R), green (G), and blue (B) unit pixels. Each of the pixels 350 may be arranged at a predetermined pitch.

The display panel D may be a flexible display in which the plurality of pixels 350 are provided and which is capable of curved and bent.

The display panel D may include a flexible substrate 318, a line electrode 320, a plurality of pixels 350 and a protective layer 390.

The flexible substrate 318 may be in contact with the substrate 310.

The line electrode 320 may be disposed on the flexible substrate 318.

An example of the pixel 350 may be a semiconductor light emitting element 350. Hereinafter, the pixel 350 and the semiconductor light emitting element 350 will be described using the same reference numeral.

The plurality of semiconductor light emitting elements 350 may be disposed on the line electrode 320.

The protective layer 390 may cover the line electrode 320 and the plurality of semiconductor light emitting elements 350.

The display panel D may include a display E and a flexible base material F.

The display E may be defined as a portion of the display panel D disposed on the front surface 311 of the substrate 310.

The display E may be defined as a pixel area or a display area.

The display E may be an area on which the semiconductor light emitting element 350 is disposed and may include a flexible substrate 318, a line electrode 320, a plurality of semiconductor light emitting elements 350, and a protective layer 390.

The flexible base material F may be defined as a portion surrounding portions of the side surface 313 of the substrate 310 and the rear surface 312 of the substrate 310. The flexible base material F may extend from the display E.

The flexible base material F may be defined as a bezel area or a non-display area.

The flexible base material F may be an area on which the semiconductor light emitting element 350 is not disposed and may include a flexible substrate 318, a line electrode 320, and a protective layer 390.

The flexible base material F may include a pair of curved portions 410 and 420 and a side cover portion 430, which connects the pair of curved portions 410 and 420 to each other and is in contact with the support layer 400.

The pair of curved portions 410 and 420 may be spaced apart from each other in a front and rear direction. The pair of curved portions 410 and 420 may include a front curved portion 410 and a rear curved portion 420, which is spaced apart from the front curved portion 410 in the front and rear direction.

Each of the pair of curved portions 410 and 420 may have an arc shape in cross-section, and particularly may have an inferior arc shape. A central angle of each of the pair of curved portions 410 and 420 may be about 80° to about 100°.

Each of the pair of curved portions 410 and 420 may have a curvature radius r. The curved portions 410 and 420 may be preferably formed so as not to be sharply bent, and it is preferable that the curvature radius r is not too large.

The side cover portion 430 may be spaced apart from the side surface 313 of the substrate 310 and be parallel to the side surface 313 of the substrate 310. The side cover portion 430 may be defined as a flat portion defined between the pair of curved portions 410 and 420.

The side cover portion 430 may be defined as a portion of the flexible base material F, which is parallel to the side surface 313 of the substrate 310. A size and shape of each of the curved portions 410 and 420 may be determined, and the curvature radius r of the curved portion 410 may be determined according to a position of the side cover portion 4300.

The position of the side cover portion 430 may be determined by the support layer 400, and each of the curved portions 410 and 420 may have a curvature radius r within an appropriate range by the support layer 400.

The support layer 400 may be disposed between the side surface 313 of the substrate 310 and the flexible base material F. The support layer 400 may support the flexible base material F. The support layer 400 may be disposed between the side surface 313 of the substrate 310 and the side cover portion 430 and may support the side cover portion 430.

The support layer 400 may be fixed to one of the side surface 313 of the substrate 310 and the flexible base material F and may be attached to the other.

For example, the support layer 400 may be attached to the side surface 313 of the substrate 310 after being disposed on the rear surface of the flexible base material F. For another example, the support layer 400 may be disposed on the side surface 303 of the substrate 310 and then attached to the flexible base material F.

For example, the support layer 400 may be applied on the flexible base material F. The support layer 400 may hold the side cover portion 430 so that the side cover portion 430 is spaced apart from the side surface 313 of the substrate 310.

The support layer 400 may support the side cover portion 430 so that the side cover portion 430 does not approach the side surface 313 of the substrate 310.

The pair of curved portions 410 and 420 may not directly support the support layer 400 and may be spaced apart from the support layer 400. The pair of curved portions 410 and 420 may not be in contact with the support layer 400.

The pair of curved portions 410 and 420 may be defined as curved portions that are separated from the support layer 400 and may be bent in a curved shape.

The support layer 400 may hold the side cover portion 430 so that the side cover portion 430 does not move in a direction that is away from the side surface 313 of the substrate 310.

The support layer 400 may be fixed to the side surface 313 of the substrate 310 after being fixed to the flexible base material F.

The display device may further include an adhesive 440. The adhesive 440 may be applied on the support layer 400 and the flexible base material F. The adhesive 440 may be disposed to cover the support layer 400. The adhesive 440 may be attached to the side surface 313 of the substrate 310.

The adhesive 440 may fix the support layer 400 to the side surface 313 of the substrate 310.

The support layer 400 may include a first surface 401 facing the side surface 313 of the substrate 310 and a second surface 402 facing the flexible base material F. The support layer 400 may have a trapezoidal cross-sectional shape.

Each of the first surface 401 and the second surface 402 may be a flat surface rather than a curved surface.

The adhesive 440 may be attached to the first surface 401 and the flexible base material F and may be attached to the side surface of the substrate 310.

An area of the second surface 402 may be greater than that of the first surface 401.

The support layer 400 and the adhesive 440 may be surrounded and protected by the side surface 313 of the substrate 310 and the flexible base material F.

The display module 300 according to this embodiment may not include a separate adhesive 440, and the support layer 400 itself may have adhesive strength.

A portion of the flexible base material F may be disposed on the rear surface 313 of the substrate 310. A portion of the flexible base material F, which is disposed on the rear surface of the substrate 310, may be defined as a connection portion 450.

The connection portion 450 may include a flexible substrate 318, a line electrode 320 and a protective layer 390.

A driving portion 460 (FIG. 10) may be disposed behind the substrate 310 to control driving of the pixel 350. The driving portion 460 may be connected to the flexible base material F and may be connected to the connection portion 450 of the flexible base material F.

The driving portion 460 may be connected to the line electrode 320 on the connection portion 450 and may be connected to a portion of the line electrode 320, which is disposed behind the substrate 310.

The flexible base material F of each of the display modules 300 may be in contact with the flexible base material F of the other display module that is adjacent thereto.

An outer surface of the flexible base material F of the first unit display 300*a* may face an outer surface of the flexible base material F of the second unit display 300*b*.

The adhesive 440, the support layer 400, the flexible base material F of the first unit display 300*a*, the flexible base material F of the second unit display 300*b*, the support layer 400, and the adhesive 440 may be disposed between the substrate 310 of the first unit display 300*a* and the substrate 310 of the second unit display 300*b*, An area between the substrate 310 of the first unit display 300*a* and the substrate 310 of the second unit display 300*b* may be a bezel area L that does not actually display a screen.

It is preferable that the plurality of display modules 300 minimize the bezel area L and have high reliability of the display panel D.

A first comparative example shown in FIG. 12 is a case in which the support layer 400 of this embodiment is not provided, and a bezel area L' is less than that of this embodiment.

A second comparative example shown in FIG. 13 is a case in which the support layer 400 of this embodiment is not provided, and a bezel area L" is less than that of this embodiment.

In the first comparative example shown in FIG. 12, a size of the bezel area L' is less because the display panel D is abruptly bent, but line resistance of the sharply bent portion C of the line electrode 320 may increase, and a disconnection defect of the line electrode 320 may occur. That is, when the line electrode 320 is bent, due to the respective thicknesses of the flexible substrate 318, the line electrode 320, and the protective layer 390, each of the curved portions 410 and 420 has a limit curvature radius, and if each of the curved portions 410 and 420 is bent below the limit curvature radius, the line electrode 320 is damaged, resistance increases, and a line breakage occurs.

In the second comparative example shown in FIG. 13, the display panel D may be gently bent to protect the line electrode 320, whereas the size of the bezel area L may increase.

FIG. 14 is a view comparing a display panel according to an embodiment of the present disclosure with a comparative example.

The curvature radius r of each of the curved portions 410 and 420 may be less than half of a thickness h of the substrate 310.

FIGS. 14A and 14B show cases in which the thickness h of the substrate 310 is greater than twice the curvature radius r of each of the curved portions 410 and 420. (i.e., 2 r<h) In addition, a length M of the support layer 400 is less than a length that is limited to twice the curvature radius r of each of the curved portions 410 and 420 in the thickness h of the substrate 310. (i.e. M<h−2 r)

FIG. 14C shows a case in which, the thickness h of the substrate 310 is equal to twice that of each of the curved portions 410 and 420, and the support layer 400 is not provided. (2 r=h)

As shown in FIGS. 14A and 14B, when the thickness h of the substrate 310 is greater than twice the limit curvature radius r (bending limit) of the flexible substrate 318, the support layer 400 may be provided.

FIGS. 15 to 19 show a process of manufacturing a display device.

FIG. 15 is a view showing a state in which a display panel is formed on a front surface of a substrate according to an embodiment of the present disclosure.

As shown in FIG. 15, a method for manufacturing a display according to this embodiment may include a process of forming a display panel D on a front surface 311 of a substrate 310' (i.e., a display panel forming process).

In the display panel forming process, a flexible substrate 318 may be formed on the front surface 311 of the substrate 310', a line electrode 320 may be formed on the flexible substrate 318, and a plurality of pixels 350 may be formed on the line electrode 320. Here, a protective layer 390 may be formed to cover portions of the plurality of pixels 350 and the line electrode 320.

FIG. 16 is a view showing a process of removing a portion of the substrate of FIG. 15.

The method for manufacturing the display according to this embodiment may further include a process of removing a portion 310" of the substrate 310' (i.e., a removing process) as shown in FIG. 16 after the process of forming the display panel.

The removing process may be a process of exposing a portion of a rear surface of the display panel D by removing the portion 310" of the substrate 310'. The removing process may be a process of exposing a portion of the flexible substrate 318, which is close to an edge of the substrate 310.

In the removing process, a scribing process may be performed on the portion 310" to be removed of the substrate 310', and then a cutting process of cutting the substrate 310' may be performed by using a laser device (not shown) or the like. Then, a separation process may be performed to separate the cut portion 310" of the substrate 310' from the display panel D.

FIG. 17 is a view showing a process of applying a support layer on the display panel of FIG. 16.

The method for manufacturing the display according to this embodiment may include a process of forming a support layer 400 (i.e., a support layer forming process) as shown in FIG. 17 after the removing process.

The support layer forming process may be a process of applying the support layer 400 on the exposed rear surface of the display panel D.

In the support layer forming process, a portion of the flexible substrate 318, which is adjacent to a side surface 313 of the substrate 310, may be coated with a polymer resin and then cured.

The support layer 400 may be disposed to be spaced apart from the side surface 313 of the substrate 310 next to the side surface 313 of the substrate 310 and may be exposed together with a portion of the front surface 311 of the substrate 318, which is not covered by the support layer 400.

FIG. 18 is a view showing a process of applying an adhesive to the support layer of FIG. 17.

The method for manufacturing the display according to this embodiment may include, as shown in FIG. 18, a process of applying an adhesive 440 on the support layer 400 and the display panel D (i.e., the support layer coating process) after the support layer forming process.

In the support layer coating process, the adhesive 440 may be applied to cover the support layer 400 and a circumference of the support layer 400 in the display panel D. The adhesive 440 may be applied on the rear surface of the flexible substrate 318.

FIG. 19 is a view showing a process of bending the display panel of FIG. 18.

The method for manufacturing the display according to this embodiment may include, after the support layer coating process, a process of bending the display panel D to be fixed to portions of the side surface 313 of the substrate 310 and the rear surface of the substrate 310 (i.e., a flexible substrate fixing process).

The display panel D shown in FIG. 18 may be divided into a display E disposed in front of the substrate 310 and a flexible base material F, which is not disposed in front of the substrate 310.

The flexible substrate fixing process may be a process of bending the flexible base material F so that the flexible base material F surrounds portions of the side surface 313 of the substrate 310 and the rear surface 312 of the substrate 310 (i.e., the bending process).

The adhesive 440 applied on the display panel D may be attached to the side surface 313 of the substrate 310 while being applied on the support layer 400 and the flexible base material F.

The adhesive 440 may be attached to the side surface 313 of the substrate 310 and the rear surface 312 of the substrate 310, and the support layer 400 may be disposed between the side surface 313 of the substrate 310 and the flexible base material F to hold the flexible base material F, particularly a side cover portion 430.

In the bending process, the display panel D, particularly the flexible base material F may include a pair of curved portions 410 and 420 and a side cover portion 430, which connects the pair of curved portions 410 and 420 to each other and is in contact with the support layer 400.

FIG. 20 is a view showing a modified example according to an embodiment of the present disclosure.

The flexible base material F may include a pair of curved portions 410 and 420 that are in contact with the support layer 440 and a side cover portion 430 connecting the pair of curved portions to each other. The support layer 400 may include a front support layer 400a and a rear support layer 400b.

The front support layer 400a may be in contact with the front curved portion 410, which is disposed at a front side, the pair of curved portions 410 and 420.

The rear support layer 400b may be in contact with the rear curved portion 420, which is disposed at a rear side, of the pair of curved portions 410 and 420.

The front support layer 400a and the rear support layer 400b may be spaced apart from each other in the front and rear direction.

The front support layer 400a and the rear support layer 400b have curved surfaces facing the flexible base material F. The front supporting layer 400a and the rear supporting layer 400b have flat surfaces facing the side surface 313 of the substrate 310.

The side cover portion 430 may be maintained in the flat surface by supporting the pair of curved portions 410 and 420 on the pair of support layers 400a and 400b.

The display device shown in FIG. 20 may have the same or similar configurations as the display device shown in FIG. 14 in configurations other than the position and shape of the support layer 400, and thus, to avoid redundant description, description thereof will be omitted.

The above-disclosed subject matter is to be considered illustrative, and not restrictive, and the appended claims are intended to cover all such modifications, enhancements, and other embodiments, which fall within the true spirit and scope of the present disclosure.

Thus, the embodiment of the present disclosure is to be considered illustrative, and not restrictive, and the technical spirit of the present disclosure is not limited to the foregoing embodiment.

Therefore, the scope of the present disclosure is defined not by the detailed description of the invention but by the appended claims, and all differences within the scope will be construed as being included in the present disclosure.

The invention claimed is:

1. A display device comprising:
    a substrate;
    a display panel comprising a display and a flexible base material,
    wherein the display is disposed on a front surface of the substrate, and the flexible base material extends from the display to surround at least a portion of each of a side surface and a rear surface of the substrate; and
    a support layer disposed between the side surface of the substrate and the flexible base material to support the flexible base material,
    wherein the flexible base material comprises:
        a pair of curved portions spaced apart from the support layer; and
        a side cover portion connecting the pair of curved portions to each other, and being in contact with the support layer, and
    wherein the support layer is coated on the flexible base material.

2. The display device according to claim 1, wherein the display panel comprises:
    a flexible substrate that is in contact with the substrate;
    a line electrode disposed on the flexible substrate;
    a plurality of semiconductor light emitting elements disposed on the line electrode; and
    a protective layer covering the line electrode and the plurality of semiconductor light emitting elements.

3. The display device according to claim 1, wherein the side cover portion of the flexible base material is spaced apart from the side surface of the substrate, and is substantially parallel to the side surface of the substrate.

4. The display device according to claim 1, wherein a curvature radius of each of the pair of curved portions of the flexible base material is less than half of a thickness of the substrate.

5. The display device according to claim 1, wherein a length of the support layer is less than a length obtained by subtracting twice a curvature radius of each of the pair of curved portions from a thickness of the substrate.

6. The display device according to claim 1, further comprising an adhesive coated to the support layer and the flexible base material to adhere to the side surface of the substrate.

7. The display device according to claim 1, wherein the support layer comprises:
   a first surface configured to face the side surface of the substrate; and
   a second surface configured to face the flexible base material,
   wherein the second surface of the support layer has an area or length greater than an area or length of the first surface of the support layer.

8. A display device, comprising:
   a plurality of display modules disposed at one or more predetermined intervals,
   wherein each of the plurality of display modules comprises:
      a substrate;
      a display panel comprising a display disposed on a front surface of the substrate and a flexible base material extending from the display to surround at least a portion of each of a side surface and a rear surface of the substrate; and
      a support layer disposed between the side surface of the substrate and the flexible base material to support the flexible base material,
   wherein the flexible base material comprises:
      a pair of curved portions spaced apart from the support layer; and
      a side cover portion connecting the pair of curved portions to each other, the side cover portion being in contact with the support layer and being substantially parallel to the side surface of the substrate,
   wherein the flexible base material is in contact with another display panel adjacent thereto, and
   wherein the display device further comprises an adhesive coated to the support layer and the flexible base material to adhere to the side surface of the substrate, for the plurality of display modules.

9. The display device according to claim 8, wherein the display panel comprises:
   a flexible substrate that is in contact with the substrate;
   a line electrode disposed on the flexible substrate;
   a semiconductor light emitting element disposed on the line electrode; and
   a protective layer covering the line electrode and the semiconductor light emitting element.

10. The display device according to claim 8, wherein a curvature radius of each of the pair of curved portions is less than half of a thickness of the substrate.

11. The display device according to claim 8, wherein a length of the support layer is less than a length obtained by subtracting twice a curvature radius of each of the pair of curved portions from a thickness of the substrate.

12. The display device according to claim 8, wherein the support layer is coated on the flexible base material.

13. A method for manufacturing a display device, the method comprising:
   forming a display panel on a front surface of a substrate;
   removing a portion of the substrate to expose a portion of a rear surface of the display panel;
   applying a support layer to the exposed rear surface of the display panel;
   coating an adhesive to the support layer and the display panel; and
   bending the display panel to be fixed to portions of a side surface and a rear surface of the substrate,
   wherein the display panel comprises:
      a pair of curved portions spaced apart from the support layer; and
      a side cover portion connecting the pair of curved portions to each other and being in contact with the support layer.

14. The method according to claim 13, wherein the side cover portion is spaced apart from the side surface of substrate and is substantially parallel to the side surface of the substrate.

15. The method according to claim 13, further comprising providing an adhesive coated to the support layer and the flexible base material to adhere to the side surface of the substrate.

16. The method according to claim 13, wherein a curvature radius of each of the pair of curved portions is less than half of a thickness of the substrate.

17. The method according to claim 13, wherein a length of the support layer is less than a length obtained by subtracting twice a curvature radius of each of the pair of curved portions from a thickness of the substrate.

18. The method according to claim 13, wherein the side surface of the substrate is substantially perpendicular to the front surface and the rear surface of the substrate.

* * * * *